United States Patent
Chen et al.

(10) Patent No.: US 12,389,611 B2
(45) Date of Patent: Aug. 12, 2025

(54) STRUCTURE AND METHOD FOR FORMING CAPACITORS FOR A THREE-DIMENSIONAL NAND

(71) Applicant: Yangtze Memory Technologies Co., Ltd., Hubei (CN)

(72) Inventors: Liang Chen, Hubei (CN); Cheng Gan, Hubei (CN); Wei Liu, Hubei (CN); Shunfu Chen, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 580 days.

(21) Appl. No.: 17/695,220

(22) Filed: Mar. 15, 2022

(65) Prior Publication Data
US 2022/0208960 A1    Jun. 30, 2022

Related U.S. Application Data

(60) Division of application No. 16/729,818, filed on Dec. 30, 2019, now Pat. No. 11,437,464, which is a
(Continued)

(51) Int. Cl.
*H10D 1/00*    (2025.01)
*H01L 21/762*    (2006.01)
(Continued)

(52) U.S. Cl.
CPC ....... *H10D 1/043* (2025.01); *H01L 21/76224* (2013.01); *H01L 23/528* (2013.01);
(Continued)

(58) Field of Classification Search
CPC ............. H01L 23/642; H01L 28/40–92; H01L 29/945; H10D 1/665; H10D 1/68–716
See application file for complete search history.

(56) References Cited

U.S. PATENT DOCUMENTS 7,473,979 B2    1/2009    Clevenger et al.
8,866,260 B2 *  10/2014    Shieh ............... H01L 24/06
                                                257/532
(Continued)

FOREIGN PATENT DOCUMENTS

CN    109155320 A    1/2019
CN    109256392 A    1/2019
(Continued)

OTHER PUBLICATIONS

International Search Report and Written Opinion of the International Searching Authority directed to related International Patent Application No. PCT/CN2019/095069, mailed Apr. 9, 2020; 9 pages.

*Primary Examiner* — Kevin Parendo
(74) *Attorney, Agent, or Firm* — Conley Rose, P.C.

(57) ABSTRACT

Embodiments of a three-dimensional capacitor for a memory device and fabrication methods are disclosed. The method includes forming, on a first side of a first substrate, a peripheral circuitry having a plurality of peripheral devices, a first interconnect layer, a deep well and a first capacitor electrode. The method also includes forming, on a second substrate, a memory array having a plurality of memory cells and a second interconnect layer, and bonding the first interconnect layer of the peripheral circuitry with the second interconnect layer of the memory array. The method further includes forming, on a second side of the first substrate, one or more trenches inside the deep well, disposing a capacitor dielectric layer on sidewalls of the one or more trenches, and forming capacitor contacts on sidewalls of the capacitor dielectric layer inside the one or more trenches.

20 Claims, 18 Drawing Sheets

Related U.S. Application Data continuation of application No. PCT/CN2019/095069, filed on Jul. 8, 2019.

(51) Int. Cl.
    *H01L 23/00*           (2006.01)
    *H01L 23/528*         (2006.01)
    *H01L 23/64*          (2006.01)
    *H01L 25/00*          (2006.01)
    *H01L 25/18*          (2023.01)
    *H10B 43/27*         (2023.01)
    *H10B 43/40*         (2023.01)
    *H10D 1/68*          (2025.01)

(52) U.S. Cl.
    CPC ............ *H01L 23/642* (2013.01); *H01L 24/08* (2013.01); *H01L 25/18* (2013.01); *H01L 25/50* (2013.01); *H10B 43/27* (2023.02); *H10B 43/40* (2023.02); *H10D 1/716* (2025.01); *H01L 2225/06548* (2013.01)

(56) References Cited

U.S. PATENT DOCUMENTS

| | | | | |
|---|---|---|---|---|
| 2007/0034959 | A1* | 2/2007 | Esmark | H01L 29/94 257/E29.345 |
| 2010/0090188 | A1 | 4/2010 | Futatsuyama | |
| 2010/0200949 | A1* | 8/2010 | Booth, Jr. | H01L 29/945 257/532 |
| 2010/0267217 | A1* | 10/2010 | Yang | H01L 21/76898 438/692 |
| 2012/0133021 | A1* | 5/2012 | Joblot | H01L 23/642 257/532 |
| 2014/0145299 | A1* | 5/2014 | Kalnitsky | H01L 29/945 257/532 |
| 2015/0102395 | A1* | 4/2015 | Park | H01L 25/0657 257/301 |
| 2015/0349121 | A1 | 12/2015 | Dasaka et al. | |
| 2016/0358954 | A1* | 12/2016 | Hoyos | H01L 27/1203 |
| 2017/0117282 | A1 | 4/2017 | Mathur et al. | |
| 2017/0194418 | A1* | 7/2017 | Papavasiliou | H01L 27/14643 |
| 2019/0043903 | A1 | 2/2019 | Gambino et al. | |
| 2019/0057974 | A1* | 2/2019 | Lu | H01L 24/89 |
| 2019/0088589 | A1 | 3/2019 | Zhu et al. | |
| 2020/0058669 | A1 | 2/2020 | Chen et al. | |
| 2021/0013303 | A1 | 1/2021 | Chen et al. | |

FOREIGN PATENT DOCUMENTS

| | | |
|---|---|---|
| CN | 109417075 A | 3/2019 |
| CN | 109461737 A | 3/2019 |

* cited by examiner

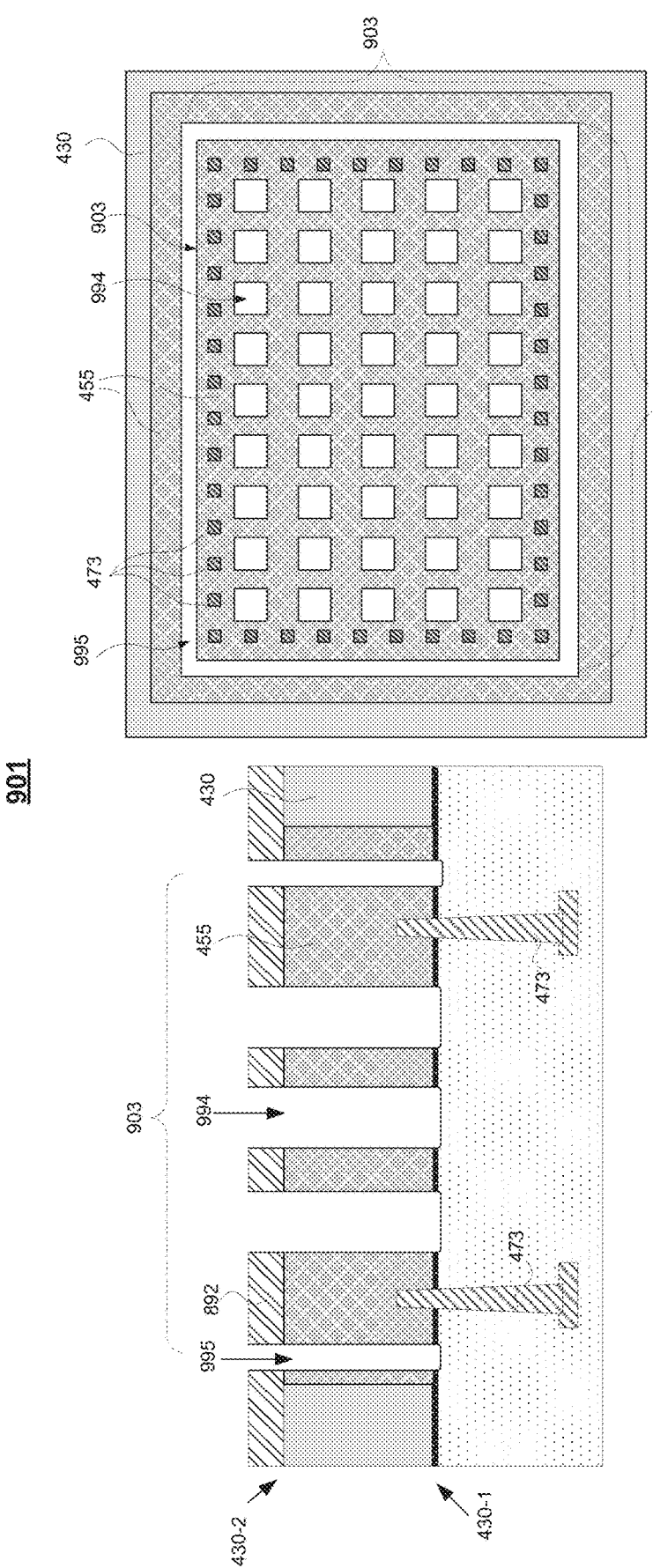

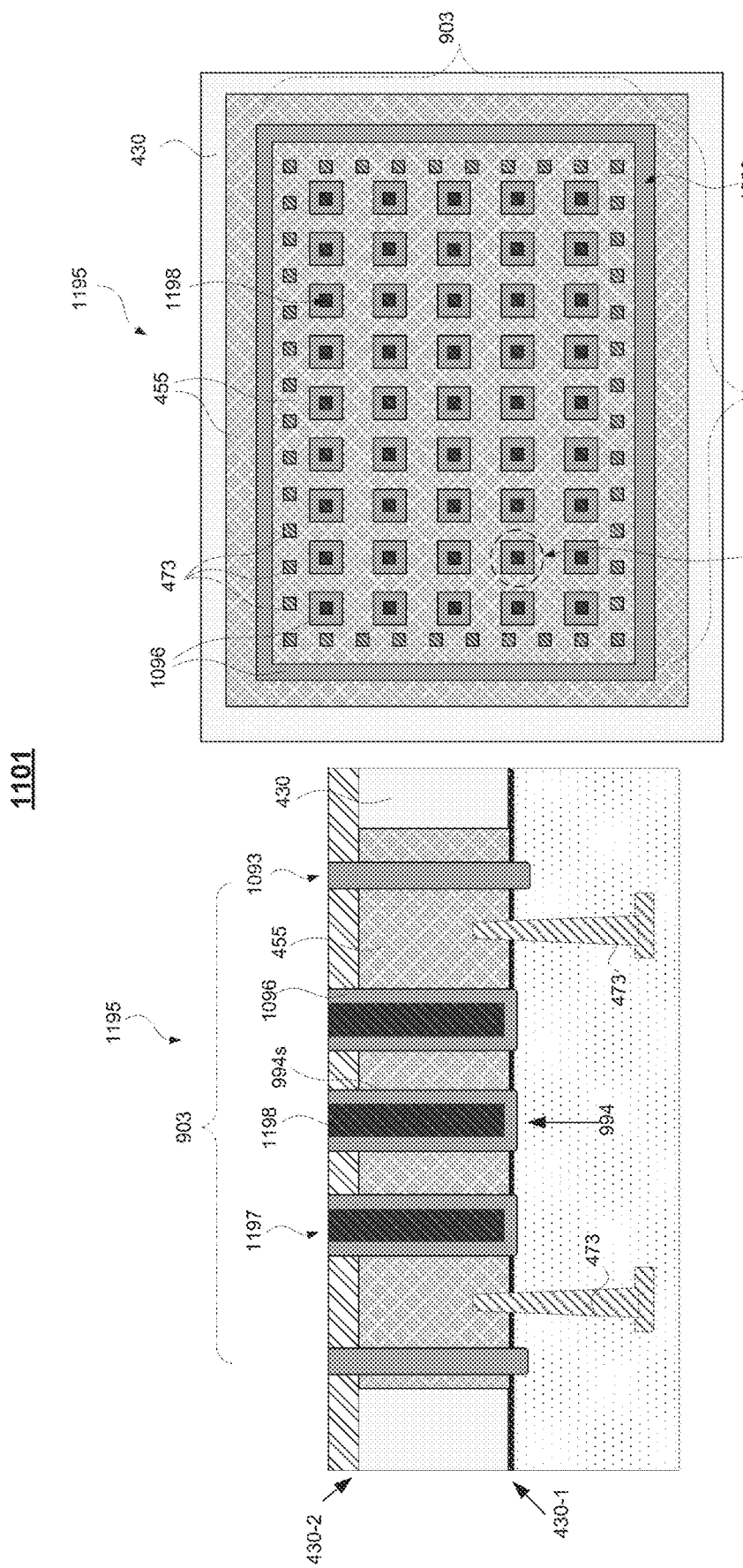

STRUCTURE AND METHOD FOR FORMING CAPACITORS FOR A THREE-DIMENSIONAL NAND

INCORPORATION BY REFERENCE

This application is a divisional of U.S. patent application Ser. No. 16/729,818, filed on Dec. 30, 2019 and titled "Structure and Method for Forming Capacitors for a Three-Dimensional NAND," which claims priority to PCT/CN2019/095069 filed on Jul. 8, 2019, which is incorporated herein by reference in its entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a conventional 3D memory, operation of memory cells need high voltage and capacitors are usually implemented as voltage booster. Currently integrated circuits for a 3D memory mainly use capacitors such as metal-oxide-silicon (MOS) capacitors, metal-oxide-metal (MOM) capacitors or polysilicon-oxide-polysilicon (POP) capacitors. As the development of 3D memory (e.g., 3D NAND flash memory) towards high density and high capacity memory cells, the number of devices (e.g., transistors) and the number of metal wirings are continuously increasing. In the meantime, to reduce manufacturing cost, the area of a memory chip remains largely unchanged. Therefore, devices in a 3D memory chip have been scaled down to smaller and smaller dimensions. Because capacitance is proportional to the area of a capacitor, a two-dimensional (2D) capacitor needs large silicon area in order to provide sufficient capacitance for the integrated circuitry of a 3D memory. To further increase capacitance, the thickness of the dielectric layer (e.g., silicon oxide) between the two electrodes of a capacitor can be thinned down. However, a capacitor with a very thin dielectric layer can suffer various reliability issues. Therefore, there is a need for a capacitor which can provide sufficiently large capacitance for the 3D memory within a reduced silicon area on a wafer.

BRIEF SUMMARY

Embodiments of a three-dimensional (3D) capacitor structure for a memory device and methods for forming the same are described in the present disclosure.

One aspect of the present disclosure provides a method for forming a 3D capacitor for a memory device, which includes forming, on a first side of a first substrate, a peripheral circuitry having a plurality of peripheral devices, a first interconnect layer, a deep well and a first capacitor electrode. The first capacitor electrode is electrically connected with the deep well. The method also includes forming, on a second substrate, a memory array having a plurality of memory cells and a second interconnect layer. The method further includes bonding the first interconnect layer of the peripheral circuitry with the second interconnect layer of the memory array, such that at least one peripheral device of the peripheral circuitry is electrically connected with at least one memory cell of the memory array. The method also includes forming, on a second side of the first substrate, one or more trenches inside the deep well, where the first and second sides are opposite sides of the first substrate. The method further includes disposing a capacitor dielectric layer on sidewalls of the one or more trenches, and forming capacitor contacts on sidewalls of the capacitor dielectric layer inside the one or more trenches.

In some embodiments, forming the 3D capacitor also includes thinning the first substrate from the second side after bonding the first and second interconnect layers. In some embodiments, thinning the first substrate includes exposing the deep well on the second side of the first substrate.

In some embodiments, forming the 3D capacitor further includes disposing a capping layer on the second side of the first substrate prior to forming one or more trenches.

In some embodiments, forming the 3D capacitor also includes forming a deep trench isolation to define an active area for the three-dimensional capacitor. In some embodiments, forming the deep trench isolation includes forming a through-silicon-trench penetrating through the first substrate and exposing a portion of the first interconnect layer, and disposing an insulating material inside the through-silicon-trench. In some embodiments, forming the deep trench isolation includes forming a through-silicon-trench penetrating through the first substrate prior to forming the one or more trenches, and exposing a portion of the first interconnect layer. In some embodiments, the through-silicon-trench has a width smaller than twice of a thickness of the capacitor dielectric layer.

In some embodiments, forming capacitor contacts includes disposing a conductive material on the sidewalls of the capacitor dielectric layer inside the one or more trenches, and removing the conductive material outside the one or more trenches. In some embodiments, removing the conductive material outside the one or more trenches includes chemical mechanical polishing.

In some embodiments, forming the 3D capacitor also includes forming a second capacitor electrode on the capacitor contacts on the second side of the first substrate.

In some embodiments, the bonding of the first interconnect layer of the peripheral circuitry with the second interconnect layer of the memory array includes dielectric-to-dielectric bonding and metal-to-metal bonding at a bonding interface.

Another aspect of the present disclosure provides a 3D capacitor for a memory device that includes a deep well formed on a second side of a first substrate. A first side of the first substrate, opposite of the second side, includes a plurality of peripheral devices and a first interconnect layer. The 3D capacitor also includes a first capacitor electrode electrically connected with the deep well. The 3D capacitor further includes one or more trenches inside the deep well, and a capacitor dielectric layer on sidewalls of the one or more trenches. The 3D capacitor also includes capacitor contacts on sidewalls of the capacitor dielectric layer inside the one or more trenches, and a second capacitor electrode disposed on the capacitor contacts.

In some embodiments, the first interconnect layer on the first side of the first substrate is bonded with a second interconnect layer of a memory array on a second substrate, such that at least one peripheral device on the first substrate is electrically connected with at least one memory cell of the memory array.

In some embodiments, the 3D capacitor also includes a deep trench isolation. The deep trench isolation penetrates through the first substrate and defines an active area for the three-dimensional capacitor.

In some embodiments, the deep trench isolation is filled with an insulating material such as silicon oxide, silicon nitride or silicon oxynitride.

In some embodiments, the capacitor dielectric layer includes silicon oxide, silicon nitride or silicon oxynitride.

In some embodiments, the capacitor dielectric layer is a high-k dielectric material, including hafnium oxide, zirconium oxide, aluminum oxide, tantalum oxide, magnesium oxide, lanthanum oxide, or a combination of two or more thereof.

In some embodiments, the one or more trenches penetrate through the deep well and extend into the first interconnect layer.

In some embodiments, the one or more trenches penetrate through a portion of the deep well on the first substrate.

In some embodiments, the capacitor contacts on the sidewalls of the capacitor dielectric layer inside the one or more trenches include tungsten, copper, aluminum, titanium, nickel, cobalt, titanium nitride, tantalum nitride, or a combination of two or more thereof.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 9B and 9C illustrate a cross-sectional and top-down views of a region of a 3D memory device, according to some embodiments of the present disclosure.

FIGS. 11B and 11C illustrate a cross-sectional and top-down views of a region of a 3D memory device, according to some embodiments of the present disclosure.

Figure 1:
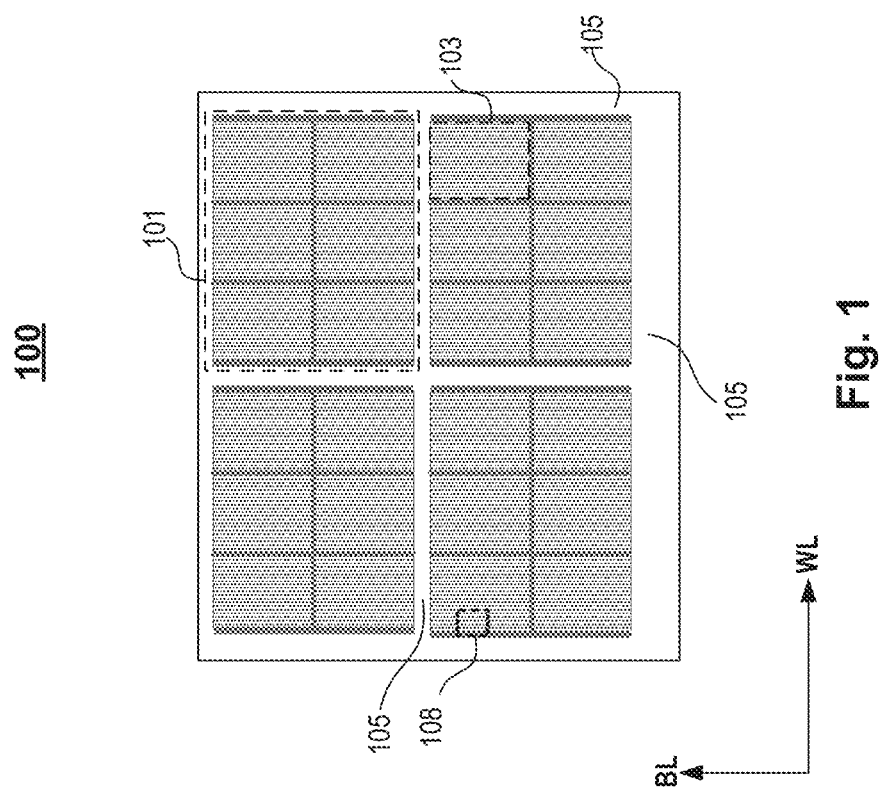
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

Various embodiments in accordance with the present disclosure provide structures and fabricating methods for vertical capacitors with higher density and less consumption of silicon area on a wafer. By using vertical capacitors instead of conventional two-dimensional (2D) capacitors, the overall memory density and manufacturing cost of a 3D NAND flash memory can be improved.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
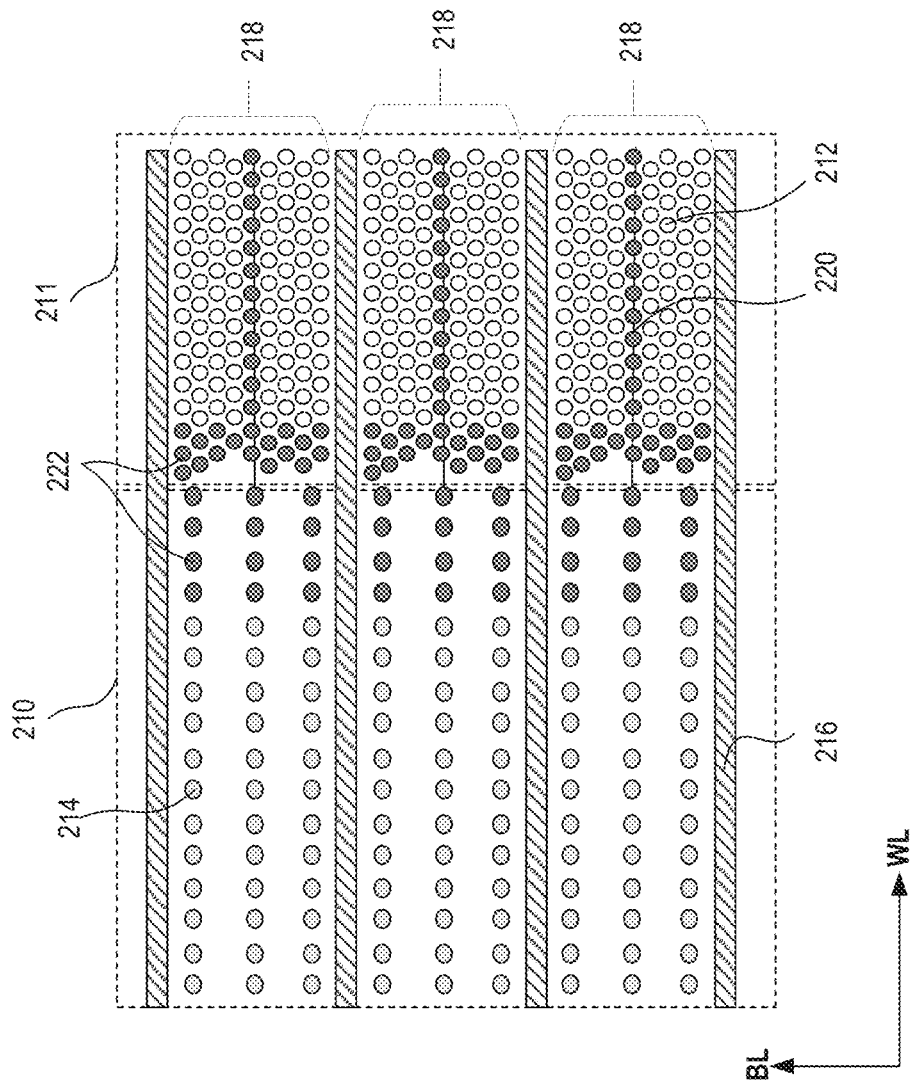
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of the memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 also includes dummy memory strings for process variation control during fabrication and/or for additional mechanical support.

Figure 3:
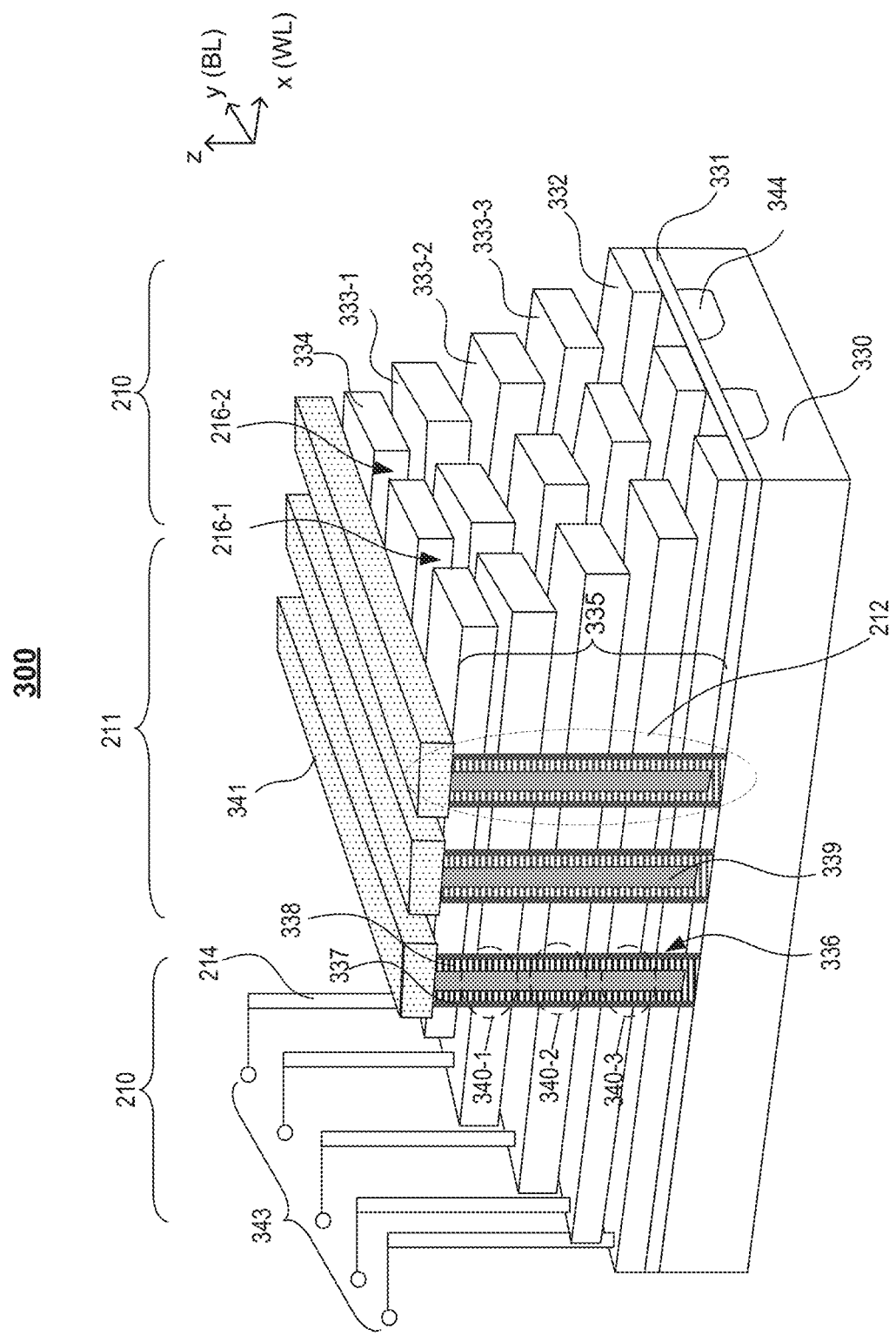
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact and dummy channel structure. These structures are not shown in FIG. 3 for simplicity.

To achieve higher storage density, the number of vertical WL stacks of a 3D memory or the number of memory cells per memory string has been greatly increased, for example, from 24 stacked WL layers (i.e. 24 L) to 128 layers or more. To further reduce the size of a 3D memory, the memory array can be stacked on top of the peripheral circuitry or vice versa. For example, the peripheral circuitry can be fabricated on a first substrate and the memory array can be fabricated on a second substrate. Then the memory array and the peripheral circuitry can be connected through various interconnects by bonding the first and second substrates together. As such, not only the 3D memory density can be increased, but also communication between the peripheral circuitry and memory array can achieve higher bandwidth and lower power consumption since the interconnect lengths can be shorter through substrate (wafer) bonding. FIGS. 4-8, 9A-9G, 10, 11A-11C, 12A-12C and 13 illustrate the structures and methods for forming a 3D memory device where peripheral circuitry is connected with memory array through wafer bonding, according to some embodiments of the present disclosure.

With the increase in the density and performance of the 3D memory device, improvement in the peripheral circuitry is also needed to provide functional support for the memory array, for example, reading, writing and erasing the data of the memory cells. Among the peripheral devices, capacitors are used to regular voltages in a 3D memory device, for example, boosting voltage for erasing memory data. Accordingly, FIGS. 4-8, 9A-9G, 10, 11A-11C, 12A-12C and 13 illustrate a 3D capacitor of a memory device at various process stages, according to some embodiments of the present disclosure.

Figure 4:
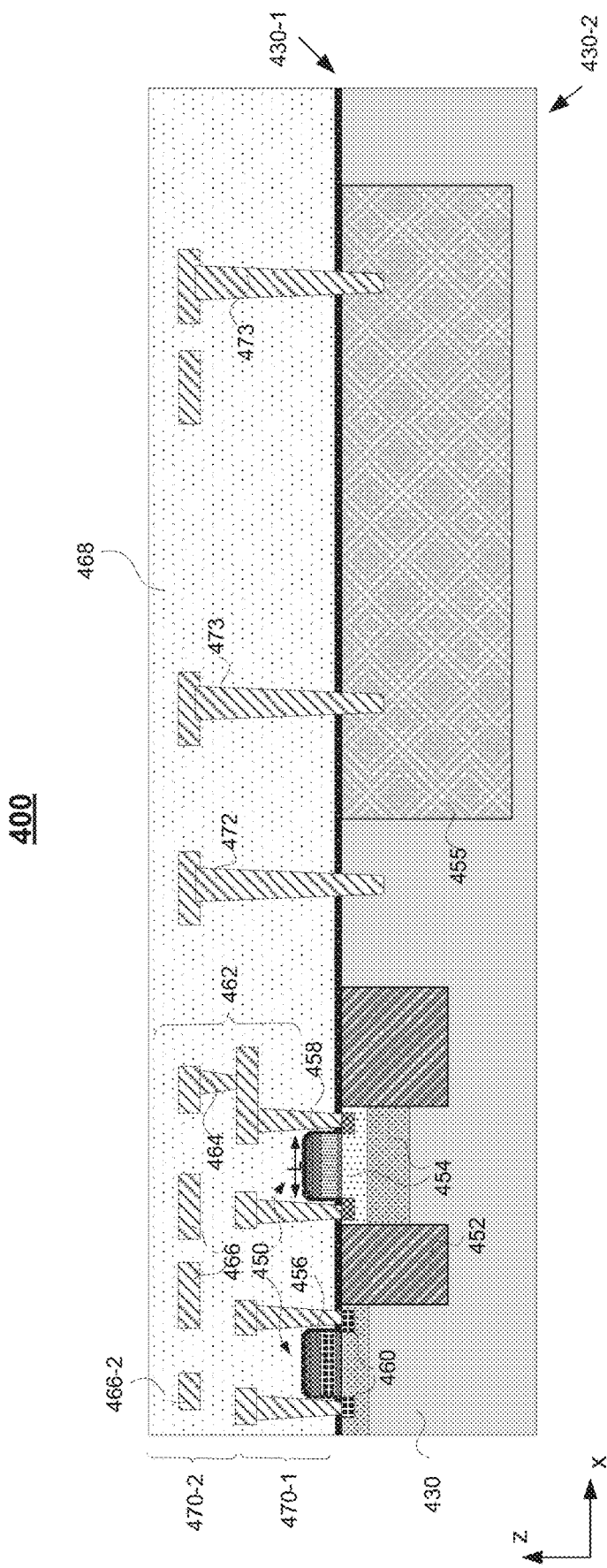
FIG. 4 illustrates a cross-sectional view of a peripheral circuitry, according to some embodiments of the present disclosure.

FIG. 4 illustrates a cross-section of an exemplary peripheral circuitry 400 of a 3D memory device according to some embodiments of the present disclosure. The peripheral circuitry 400 can include a first substrate 430, where the first substrate 430 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, the first substrate 430 can be double-side polished prior to peripheral device fabrication. In this example, the first substrate 430 includes surfaces on the top and bottom sides (also referred to as a first side 430-1 and a second side 430-2, or a front side and a backside, respectively) both polished and treated to provide a smooth surface for high quality semiconductor devices. The first and second sides are opposite sides of the first substrate.

The peripheral circuitry 400 can include one or more peripheral devices 450 on a first side 430-1 of the first substrate 430. The peripheral device 450 can be formed "on" the first substrate 430, in which the entirety or part of the peripheral device 450 is formed in the first substrate 430 (e.g., below the top surface of the first substrate 430) and/or directly on the first substrate 430. The peripheral device 450 can include any suitable semiconductor devices, for example, metal oxide semiconductor field effect transistors (MOSFETs), bipolar junction transistors (BJTs), diodes, resistors, capacitors, inductors, etc. Among the semiconductor devices, p-type and/or n-type MOSFETs (i.e., CMOS)

are widely implemented in logic circuit design, and are used as examples for the peripheral device 450 in the present disclosure. In this example, the peripheral circuitry 400 is also referred to CMOS wafer 400.

A peripheral device 450 can be either a p-channel MOSFET or an n-channel MOSFET and can include, but not limited to, an active device region surrounded by shallow trench isolation (STI) 452, a well 454 formed in the active device region with n-type or p-type doping, a gate stack 456 that includes a gate dielectric, a gate conductor and/or a gate hard mask. The peripheral device 450 can also include a source/drain extension and/or halo region (not shown in FIG. 4), a gate spacer 458 and a source/drain 460 locating on each side of the gate stack. The peripheral device 450 can further include a silicide contact area (not shown) in the top portion of the source/drain. Other known devices can be also formed on the first substrate 430. The structure and fabrication method of the peripheral device 450, are known to those skilled in the art, and are incorporated herein for entirety.

The STI 452 can be formed through patterning the substrate using lithography and etching, filling an insulating material and polishing the insulating material to form a coplanar surface on the first substrate 430. An insulating material for STI can include silicon oxide, silicon oxynitride, TEOS, low-temperature oxide (LTO), high temperature oxide (HTO), silicon nitride, etc. An insulating material for STI 452 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, or combinations thereof. The forming of STI 452 can also include a high temperature annealing step to densify the disposed insulating material for improved electrical isolation. Other STI structures can be employed, as would be apparent to a person of ordinary skill in the art.

The well 454 of the peripheral device 450 can include a p-type doping for n-channel MOSFET and an n-type doping for p-channel MOSFET, and is called p-well and n-well, respectively. The dopant profile and concentration of the well 454 affects the device characteristics of the peripheral device 450. For MOSFET devices with low threshold voltage ($V_t$), the well 454 can be doped with lower concentration, and can form low-voltage p-well or low-voltage n-well. For MOSFET with high $V_t$, the well 454 can be doped with higher concentration, and can form high-voltage p-well or high-voltage n-well. In some embodiments, to provide electrical isolation from a p-type substrate, a deep n-well can be formed underneath a high-voltage p-well for an n-channel MOSFET with high $V_t$. In some embodiments, a depth of the well 454 can be deeper than a depth of the STI 452.

The forming of an n-well can include any suitable n-type dopant, such as phosphorus, arsenic, antimony, etc., and/or any combination thereof. The forming of a p-well can include any suitable p-type dopant, for example boron. The dopant incorporation can be achieved through ion implantation followed by activation anneal, or through in-situ doping during epitaxy for the active device region.

The gate stack 456 of the peripheral device 450 can be formed by a "gate first" scheme, where the gate stack 456 is disposed and patterned prior to source/drain formation. The gate stack 456 of the peripheral device 450 can also be formed by a "replacement" scheme, where a sacrificial gate stack can be formed first and then replaced by a high-k dielectric layer and a gate conductor after source/drain formation.

In some embodiments, the gate dielectric can be made of silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The gate dielectric can be disposed by any suitable methods such as CVD, PVD, PECVD, LPCVD, RTCVD, sputtering, MOCVD, ALD, thermal oxidation or nitridation, or combinations thereof.

In some embodiments, the gate conductor can be made from a metal or metal alloy, such as tungsten, cobalt, nickel, copper, or aluminum, and/or combinations thereof. In some embodiments, the gate conductor can also include a conductive material, such as titanium nitride (TiN), tantalum nitride (TaN), etc. The gate conductor can be formed by any suitable deposition methods, for example, sputtering, thermal evaporation, e-beam evaporation, ALD, PVD, and/or combinations thereof.

In some embodiments, the gate conductor can also include a poly-crystalline semiconductor, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, etc. In some embodiments, the gate conductor can also be an amorphous semiconductor with aforementioned materials.

In some embodiments, the gate conductor can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

The gate spacer 458 can be formed through disposing an insulating material and then performing anisotropic etching. The insulating material for the gate spacer 458 can be any insulator, including silicon oxide, silicon nitride, silicon oxyntiride, TEOS, LTO, HTO, etc. The gate spacer 458 can be disposed using techniques such as CVD, PVD, PECVD, LPCVD, RTCVD, MOCVD, ALD, sputtering, or combinations thereof. The anisotropic etching of the gate spacer 458 includes dry etching, for example reactive ion etching (ME).

A gate length L of the gate stack 456 between the source/drain 460 is an important feature of the MOSFET. During operation of a MOSFET, a top portion of the well underneath the gate stack 456 can conduct current from source to drain, and is so called channel of the MOSFET. The gate length L (also referred to as channel length) determines the magnitude of drive current of a MOSFET and is therefore scaled down aggressively for logic circuits. The gate length L can be less than about 100 nm. In some embodiments, the gate length can be in a range between about 5 nm to about 30 nm. Patterning of the gate stack with such a small dimension is very challenging, and can use techniques including optical proximity correction, double exposure and/or double etching, self-aligned double patterning, etc.

In some embodiments, the source/drain 460 of the peripheral device 450 is incorporated with high concentration dopants. For n-type MOSFETs, the dopant for source/drain 460 can include any suitable n-type dopant, such as phosphorus, arsenic, antimony, etc., and/or any combination thereof. For p-type MOSFETs, the dopant for source/drain 460 can include any suitable p-type dopant, for example boron. The dopant incorporation can be achieved through ion implantation followed by dopant activation anneal. The source/drain 460 can be made of the same material as the first substrate 430, for example, silicon. In some embodiments, the source/drain 460 of the peripheral device 450 can be made of a different material from the first substrate 430 to achieve high performance. For example, on a silicon substrate, the source/drain 460 for a p-type MOSFETs can include SiGe and the source/drain 460 for an n-type MOSFETs can be incorporated with carbon. The forming of the source/drain 460 with a different material can include etching back the substrate material in the source/drain area and disposing new source/drain material using techniques such as epitaxy. Doping for source/drain 460 can also be achieved through in-situ doping during epitaxy.

The peripheral device 450 can also have an optional source/drain extension and/or halo region (not shown in FIG. 4) along each side of the gate stack 456. The source/drain extension and/or halo region locates inside the active device region below the gate stack, and is implemented mainly for improved short channel control for the peripheral device 450 with a channel length less than about 0.5 µm. The forming of the source/drain extension and/or halo region can be similar to the forming of the source/drain 460, but may use different implantation conditions (e.g., dose, angle, energy, species, etc.) to obtain optimized doping profile, depth or concentration.

The peripheral device 450 can be formed on the first substrate 430 with a planar active device region (as shown in FIG. 4), where the direction of MOSFET's channel and current flow is parallel to a surface of the first substrate 430. In some embodiments, the peripheral device 450 can also be formed on the first substrate 430 with a 3D active device region, for example a so-called "FINFET" in a shape like a "FIN" (not shown), where the gate stack of the MOSFET is wrapped around the FIN, and the MOSFET's channel lies along three sides of the FIN (top and two sidewalls under the gate). The structure and methods for FINFET device are known to those skilled in the art and are not discussed further in present disclosure.

In some embodiments, the peripheral circuitry 400 can include a peripheral interconnect layer 462 (or a first interconnect layer) on the first side 430-1, above the peripheral devices 450, to provide electrical connections between different peripheral devices 450 and external devices (e.g., power supply, another chip, I/O device, etc.). The peripheral interconnect layer 462 can include one or more interconnect structures, for example, one or more vertical contact structures 464 and one or more lateral conductive lines 466. The contact structure 464 and conductive line 466 can broadly include any suitable types of interconnects, such as middle-of-line (MOL) interconnects and back-end-of-line (BEOL) interconnects. The contact structure 464 and conductive line 466 in the peripheral circuitry 400 can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides ($WSi_x$, $CoSi_x$, $NiSi_x$, $AlSi_x$, etc.), metal alloys, or any combination thereof. The conductive materials can be deposited by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

The peripheral interconnect layer 462 can further include an insulating layer 468. The insulating layer 468 in the peripheral interconnect layer 462 can include insulating materials, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof.

In FIG. 4, two conductive levels 470-1 and 470-2 (also referred to as "metal levels") are illustrated as an example, where each metal level 470 (e.g., 470-1 or 470-2) include the contact structures 464 and the conductive lines 466. The conductive lines 466 of the same metal level are located at the same distance from the first substrate 430. The number of metal levels 470 for the peripheral circuitry 400 is not limited and can be any number optimized for the performance of the 3D memory.

The peripheral interconnect layer 462 can be formed by stacking metal levels 470 from bottom to the top of the peripheral circuitry 400. In the example of the peripheral circuitry 400 in FIG. 4, the bottom metal level 470-1 can be formed first and then the upper metal level 470-2 can be formed on top of the bottom metal level 470-1. Fabrication processes of each metal level 470 can include, but not limited to, disposing a portion of the insulating layer 468 with a thickness required for the metal level, patterning the portion of the insulating layer 468 using photo lithography and dry/wet etching to form contact holes for the contact structures 464 and the conductive lines 466, disposing conductive materials to fill the contact holes for the contact structures 464 and the conductive lines 466, and removing excessive conductive materials outside the contact holes by using planarization process such as chemical mechanical polishing (CMP) or reactive ion etching (ME).

In some embodiments, peripheral circuitry 400 also includes one or more substrate contacts 472, where the substrate contacts 472 provide electrical connections to the first substrate 430. The substrate contact 472 can include one or more conductive levels 470 with multiple tiers of vertical contact structures 464 and lateral conductive lines 466. In FIG. 4, substrate contact 472 with one tier of contact structure and conductive line is shown as an example, where the vertical contact structure of the substrate contact 472 extends through the insulating layer 468 and electrically contacts the first substrate 430.

In some embodiments, the topmost conductive lines 466 (e.g., 466-2 in FIG. 4) can be exposed as the top surface of the peripheral circuitry 400, where the topmost conductive lines 466-2 can be directly connected with the conductive lines on another chip or an external device.

In some embodiments, the topmost conductive lines 466-2 can be embedded inside the insulating layer 468 (as shown in FIG. 4), where the insulating material on top of the conductive lines 466 provide scratch protection during shipping or handling. Electrical connections to the topmost conductive lines 466 can be established later by forming metal VIAs, or simply by etching back the insulating layer 468 using dry/wet etching.

The peripheral device 450, however, is not limited to MOSFET. The structures of the other devices, for example diodes, resistors, capacitors, inductors, BJTs, etc., can be formed simultaneously during MOSFETs fabrication through different mask design and layout. To form devices other than MOSFETs, process steps can be added or modified in a MOSFET's process flow, for example, processes to obtain different dopant profiles, film thicknesses or material stacks, etc. In some embodiments, the peripheral device 450 other than MOSFET can also be fabricated with additional design and/or lithography mask levels to achieve specific circuit requirements.

In some embodiments, a plurality of the peripheral devices 450 can be used to form any digital, analog, and/or mixed-signal circuits for the operation of the peripheral circuitry 400. The peripheral circuitry 400 can perform, for example, row/column decoding, timing and control, reading, writing and erasing data of the memory array, etc.

In some embodiments, a 3D capacitor can be formed for the peripheral circuitry 400. For example, a deep well 455 can be formed in the first substrate 430 while forming the wells 454 for MOSFETs. The deep well 455 can be p-type doped or n-type doped. The n-type dopant can be phosphorus, arsenic, antimony, etc. The p-type dopant can be, for example, boron. The dopant incorporation can be achieved through ion implantation from the first side 430-1 of the first substrate 430, followed by activation anneal. In some embodiments, the deep well 455 can be formed on the first side 430-1 of the first substrate 430 through epitaxy and in-situ doping. The implantation for the deep well 455 can be performed right before or after the implantation for the well 454. The dopant activation anneal for deep well 455 can be performed simultaneously as that for the well 454.

In some embodiments, the deep well 455 can have a depth in a range between 1 μm to 5 μm. In some embodiments, the deep well 455 is highly doped. For example, the deep well 455 can be doped to $1\times10^{18}$ cm$^{-3}$ or higher, i.e., having a dopant concentration higher than $1\times10^{18}$ cm$^{-3}$.

In some embodiments, a deep well contact 473 can be formed to provide electrical connections to the deep well 455 and can serve as one of the two electrodes (e.g., anode) of a 3D capacitor. As such, the deep well contact 473 is also referred to as the first capacitor electrode. In some embodiments, the deep well contact 473 forms ohmic contact with the deep well 455. The deep well contact 473 can form electrical connection with corresponding circuits of the peripheral circuitry 400 through the contact structures 464 and the conductive lines 466 in the peripheral interconnect layer 462. For example, The deep well contact 473 can be connected with the ground, the substrate contact 472 of the first substrate 430, the source or drain 460 or the gate stack 456 of peripheral device 450, etc.

The deep well contacts 473 can be formed inside the insulating layer 468 and can include one or more contact structures 464 and one or more conductive lines 466. In some embodiments, the deep well contact 473 is similar to substrate contact 472 and can include one tier of vertical contact structure and lateral conductive line. In some embodiments, the deep well contact 473 can be formed simultaneously with the contact structures 464, conductive lines 466 and/or the substrate contact 472.

Figure 5:
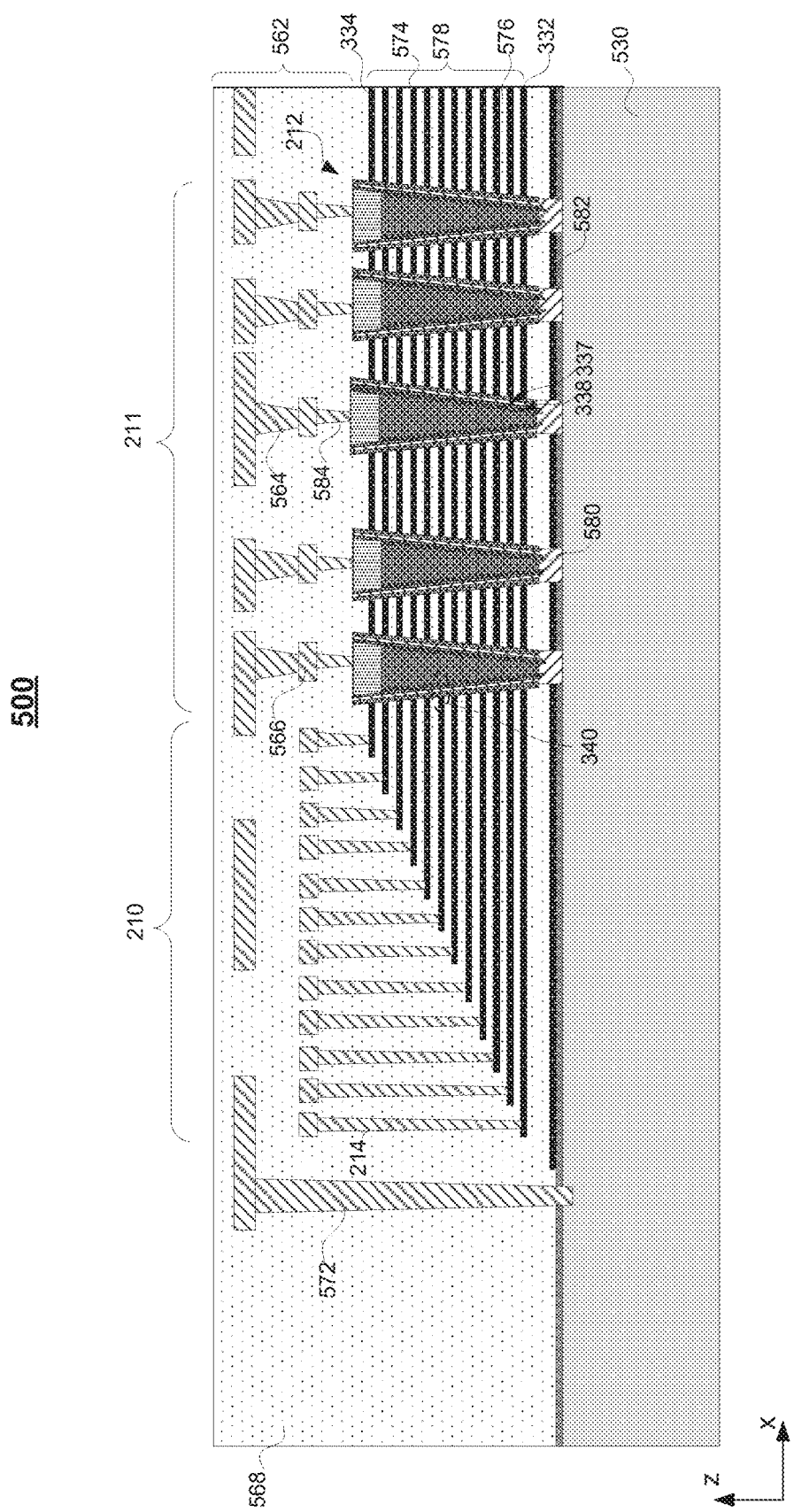
FIG. 5 illustrates a cross-sectional view of a memory array, according to some embodiments of the present disclosure.

FIG. 5 illustrates a cross-section of an exemplary 3D memory array 500, according to some embodiments of the present disclosure. The 3D memory array 500 (also referred to as memory array) can be a 3D NAND memory array and can include a second substrate 530, the memory cells 340 and an array interconnect layer 562 (or a second interconnect layer). The second substrate 530 can be similar to the first substrate 430. The array interconnect layer 562 can be similar to the peripheral interconnect layer 462 and can be formed using similar materials and similar processes. For example, interconnect structures (e.g., contact structures 564 and conductive lines 566) and insulating layer 568 of the array interconnect layer 562 are similar to the interconnect structures (e.g., contact structures 464, conductive lines 466) and insulating layer 468 of the peripheral interconnect layer 462, respectively.

In some embodiments, the 3D memory array 500 can be a memory array for 3D NAND Flash memory in which the memory cells 340 can be stacked vertically as the memory strings 212. The memory string 212 extends through a plurality of conductor layer 574 and dielectric layer 576 pairs. The plurality of conductor/dielectric layer pairs are also referred to herein as an "alternating conductor/dielectric stack" 578. The conductor layers 574 and the dielectric layers 576 in alternating conductor/dielectric stack 578 alternate in the vertical direction. In other words, except the ones at the top or bottom of the alternating conductor/dielectric stack 578, each conductor layer 574 can be sandwiched by two dielectric layers 576 on both sides, and each dielectric layer 576 can be sandwiched by two conductor layers 574 on both sides. The conductor layers 574 can each have the same thickness or have different thicknesses. Similarly, the dielectric layers 576 can each have the same thickness or have different thicknesses. In some embodiments, the alternating conductor/dielectric stack 578 includes more conductor layers or more dielectric layers with different materials and/or thicknesses than the conductor/dielectric layer pair. The conductor layers 574 can include conductor materials such as W, Co, Cu, Al, Ti, Ta, TiN, TaN, Ni, doped silicon, silicides (e.g., NiSix, WSix, CoSix, TiSix) or any combination thereof. The dielectric layers 576 can include dielectric materials such as silicon oxide, silicon nitride, silicon oxynitride, or any combination thereof.

As shown in FIG. 5, each memory string 212 can include the channel layer 338 and the memory film 337. In some embodiments, the channel layer 338 includes silicon, such as amorphous silicon, polysilicon, or single crystalline silicon. In some embodiments, the memory film 337 is a composite layer including a tunneling layer, a storage layer (also known as "charge trap/storage layer"), and a blocking layer. Each memory string 212 can have a cylinder shape (e.g., a pillar shape). The channel layer 338, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide).

In some embodiments, each conductor layer 574 in alternating conductor/dielectric stack 578 can act as the control gate for each memory cell of memory string 212 (for example control gates 333 in FIG. 3). As shown in FIG. 5, the memory string 212 can include the lower select gate 332 (e.g., a source select gate) at a lower end of the memory string 212. The memory string 212 can also include the top select gate 334 (e.g., a drain select gate) at an upper end of the memory string 212. As used herein, the "upper end" of a component (e.g., memory string 212) is the end further away from second substrate 530 in the z-direction, and the "lower end" of the component (e.g., memory string 212) is the end closer to second substrate 530 in the z-direction. As shown in FIG. 5, for each memory string 212, the drain select gate 334 can be above the source select gate 332. In some embodiments, the select gates 332/334 include conductor materials such as W, Co, Cu, Al, doped silicon, silicides, or any combination thereof.

In some embodiments, the 3D memory array 500 includes an epitaxial layer 580 on an lower end of the channel layer 338 of the memory string 212. The epitaxial layer 580 can include a semiconductor material, such as silicon. The epitaxial layer 580 can be epitaxially grown from a semiconductor layer 582 on the second substrate 530. The semiconductor layer 582 can be un-doped, partially doped (in the thickness direction and/or the width direction), or fully doped by p-type or n-type dopants. For each memory string 212, the epitaxial layer 580 is referred to herein as an "epitaxial plug." The epitaxial plug 580 at the lower end of each memory string 212 can contact both the channel layer 338 and a doped region of semiconductor layer 582. The epitaxial plug 580 can function as the channel of the lower selective gate 332 at the lower end of memory string 212.

In some embodiments, the array device further includes multiple contact structures 214 of word lines (also referred to as word line contacts) in the staircase region 210. Each word line contact structure 214 can form electrical contact with the corresponding conductor layer 574 in the alternating conductor/dielectric stack 578 to individually control the memory cell 340. The word line contact structure 214 can be formed by dry/wet etching of a contact hole, followed by filling with a conductor, for example, W, Ti, TiN, Cu, TaN, Al, Co, Ni, or any combination thereof.

As shown in FIG. 5, the 3D memory array 500 also includes bit line contacts 584 formed on the top of the memory strings 212 to provide individual access to the channel layer 338 of the memory strings 212. The conductive lines connected with the word line contact structures 214 and the bit line contacts 584 form word lines and bit lines of the 3D memory array 500, respectively. Typically the word lines and bit lines are laid perpendicular to each other (e.g., in rows and columns, respectively), forming an "array" of the memory.

In some embodiments, the 3D memory array 500 also includes a substrate contact 572 of the second substrate 530. The substrate contact 572 can be formed using similar material and process as the substrate contact 472 of the first substrate 430. The substrate contact 572 can provide electrical connection to the second substrate 530 of the 3D memory array 500.

Figure 6:
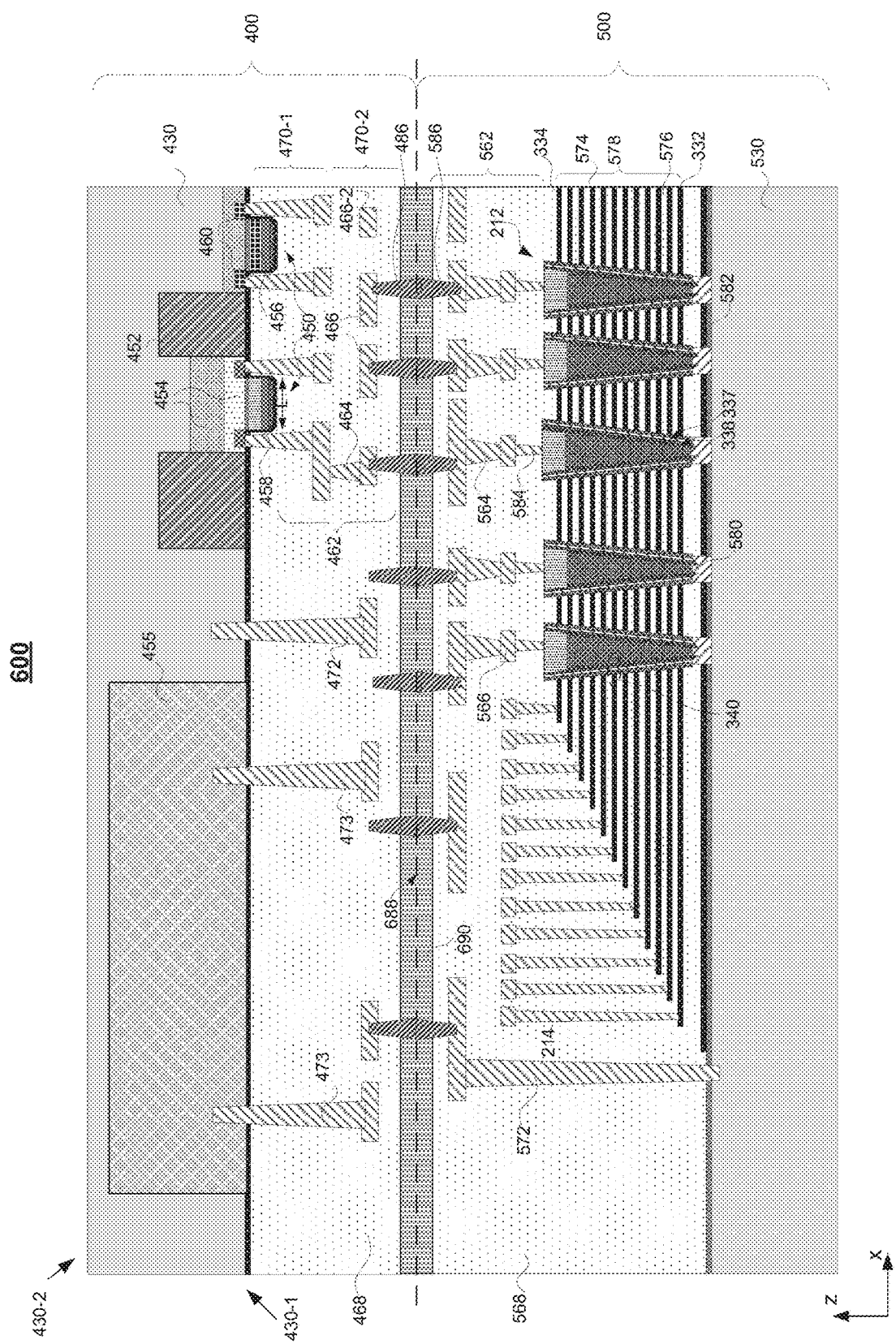
FIG. 6 illustrates a cross-sectional view of a 3D memory device after bonding the peripheral circuitry and the memory array, according to some embodiments of the present disclosure.

FIG. 6 illustrates a cross-section of an exemplary 3D memory device 600, according to some embodiments of the present disclosure. The 3D memory device 600 includes the peripheral circuitry 400 fabricated on the first substrate 430 and the 3D memory array 500 fabricated on the second substrate 530. In this example, the peripheral circuitry 400 is flipped upside down and joined with the 3D memory array 500 with direct bonding or hybrid bonding. At a bonding interface 688, the peripheral circuitry 400 and the 3D memory array 500 are electrically connected through a plurality of interconnect VIAs 486/586.

In some embodiments, the bonding interface 688 of the 3D memory device 600 situates between the insulating layer 468 of the peripheral interconnect layer 462 and the insulating layer 568 of the array interconnect layer 562. Interconnect VIAs 486 and 586 can be joined at bonding interface 688 to electrically connect any conductive line 466 or contact structure 464 of the peripheral interconnect layer 462 and any conductive line 566 or contact structure 564 of the array interconnect layer 562. As such, the peripheral circuitry 400 and the 3D memory array 500 can be electrically connected.

In some embodiments, the bonding interface 688 of the 3D memory device 600 situates inside a bonding layer 690. In this example, the interconnect VIAs 486 and 586 extend through the bonding layer 690 and also form electrical connections between any conductive line 466 or contact structure 464 of the peripheral interconnect layer 462 and the conductive line 566 or contact structure 564 of the array interconnect layer 562. As such, the peripheral circuitry 400 and the 3D memory array 500 can also be electrically connected.

In some embodiments, the bonding layer 690 can be disposed on top of the peripheral circuitry 400 (in FIG. 4) and/or the 3D memory array 500 (in FIG. 5) prior to bonding process. The bonding layer 690 can include dielectric materials such as silicon oxide, silicon nitride, silicon oxynitride or any combination thereof. The bonding layer 690 can also include adhesion materials, for example, epoxy resin, polyimide, dry film, photosensitive polymer, etc. The bonding layer 690 can be formed by one or more thin film deposition processes such as CVD, PVD, PECVD, ALD, high-density-plasma CVD (HDP-CVD), sputtering, spin-coating, or any combination thereof.

In some embodiments, after forming the bonding layers 690, the interconnect VIAs 486 and 586 can be formed for the peripheral circuitry 400 and the 3D memory array 500, respectively. The interconnect VIAs 486/586 can include metal or metal alloy such as copper (Cu), tin (Sn), nickel (Ni), gold (Au), silver (Ag), titanium (Ti), aluminum (Al), titanium nitride (TiN), tantalum nitride (TaN), etc., or any combination thereof. The metal or metal alloy of the interconnect VIAs 486/586 can be disposed by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

The fabrication process of the interconnect VIAs 486/586 can further include, but not limited to, photolithography, wet/dry etching, planarization (e.g., CMP, or RIE etchback), etc.

In some embodiments, the peripheral circuitry 400 and the 3D memory array 500 can be bonded together at die level (e.g., die-to-die, or chip-to-chip) or at wafer level (e.g., wafer-to-wafer or chip-to-wafer), depending on the product design and manufacturing strategy. Bonding at wafer level can provide high throughput, where all the dies/chips on the first substrate 430 with the peripheral circuitry 400 can be joined simultaneously with the second substrate 530 with the 3D memory array 500. Individual 3D memory device 600 can be diced after wafer bonding. On the other hand, bonding at die level can be performed after dicing and die testing, where functional dies of the peripheral circuitry 400 and 3D memory array 500 can be selected first and then bonded to form 3D memory device 600, enabling higher yield of 3D memory device 600.

In some embodiments, during the bonding process, the peripheral interconnect layer 462 can be aligned with the array interconnect layer 562 when the interconnect VIAs 486 of the peripheral circuitry 400 are aligned with corresponding interconnect VIAs 586 of the 3D memory array 500. As a result, corresponding interconnect VIAs 486/586 can be connected at the bonding interface 688 and the 3D memory array 500 can be electrically connected with the peripheral circuitry 400.

In some embodiments, the peripheral circuitry 400 and the 3D memory array 500 can be joined by hybrid bonding. Hybrid bonding, especially metal/dielectric hybrid bonding, can be a direct bonding technology (e.g., forming bonding between surfaces without using intermediate layers, such as solder or adhesives), which obtains metal-metal bonding and dielectric-dielectric bonding simultaneously.

In some embodiments, the peripheral circuitry 400 and the 3D memory array 500 can be bonded by using the bonding layer 690. At the bonding interface 688, the bonding can take place between silicon nitride to silicon nitride, silicon oxide to silicon oxide, or silicon nitride to silicon oxide, in addition to metal to metal bonding. In some embodiments, the bonding layer can also include an adhesive material to enhance bonding strength, for example, epoxy resin, polyimide, dry film, etc.

In some embodiments, a treatment process can be used to enhance the bonding strength at the bonding interface 688. The treatment process can prepare the surfaces of array interconnect layer 562 and the peripheral interconnect layer 462 so that the surfaces of the insulating layers 562/462 form chemical bonds. The treatment process can include, for example, plasma treatment (e.g. with F, Cl or H containing plasma) or chemical process (e.g., formic acid). In some embodiments, the treatment process can include a thermal process that can be performed at a temperature from about 250° C. to about 600° C. in a vacuum or an inert ambient (e.g., with nitrogen or Argon). The thermal process can cause metal inter-diffusion between the interconnect VIAs 486 and 586. As a result, metallic materials in the corresponding pairs of the interconnect VIAs can be inter-mixed with each other or forming alloy after the bonding process.

After bonding the peripheral and array interconnect layers together, at least one peripheral device of the peripheral circuitry 400 fabricated on the first substrate 430 can be electrically connected with at least one memory cell of the 3D memory array 500 fabricated on the second substrate 530.

FIG. 6 illustrates an embodiment that the peripheral circuitry 400 is bonded on top of the 3D memory array 500. In some embodiments, the 3D memory array 500 can be bonded on top of the peripheral circuitry 400.

Through bonding, the 3D memory device 600 can function similar to a 3D memory where peripheral circuitry and memory array are fabricated on the same substrate (as shown in FIG. 1). By stacking the 3D memory array 500 and the peripheral circuitry 400 on top of each other, the density of the 3D memory device 600 can be increased. In the meantime, the bandwidth of the 3D memory device 600 can be increased because of the interconnect distance between the peripheral circuitry 400 and the 3D memory array 500 can be reduced by using the stacked design.

Figure 7:
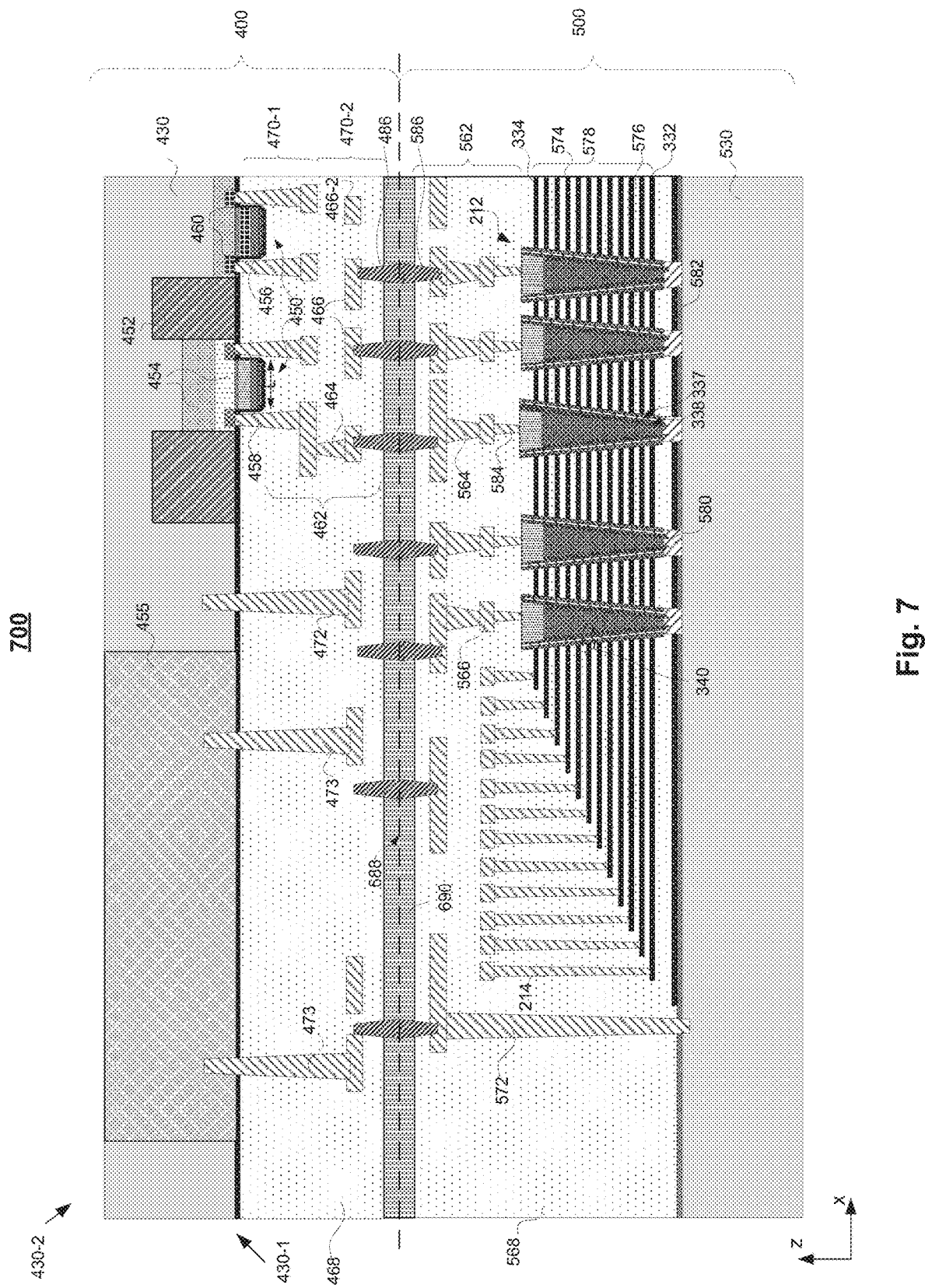
FIGS. 7, 8 and 9A illustrate cross-sectional views of a 3D memory device at various process stages, according to some embodiments of the present disclosure.

FIG. 7 illustrates a cross-sectional view of a 3D memory device 700, according to some embodiments of the present disclosure. The 3D memory device 700 resembles the 3D memory device 600 in FIG. 6, also including the peripheral circuitry 400 and the 3D memory array 500, where the peripheral circuitry 400 is bonded to the 3D memory array 500 at the bonding interface 688. The 3D memory device 700 can be formed by thinning the first substrate 430 of the peripheral circuitry 400 after forming the 3D memory device 600 through bonding.

In some embodiments, the first substrate 430 of the peripheral circuitry 400 can be thinned down from the backside 430-2 (or the second side) to expose the deep well 455. In some embodiments, substrate thinning process can include one or more of grinding, dry etching, wet etching, and chemical mechanical polishing (CMP). The thickness of the first substrate 430 after thinning can be in a range between 1 μm to 5 μm.

Figure 8:
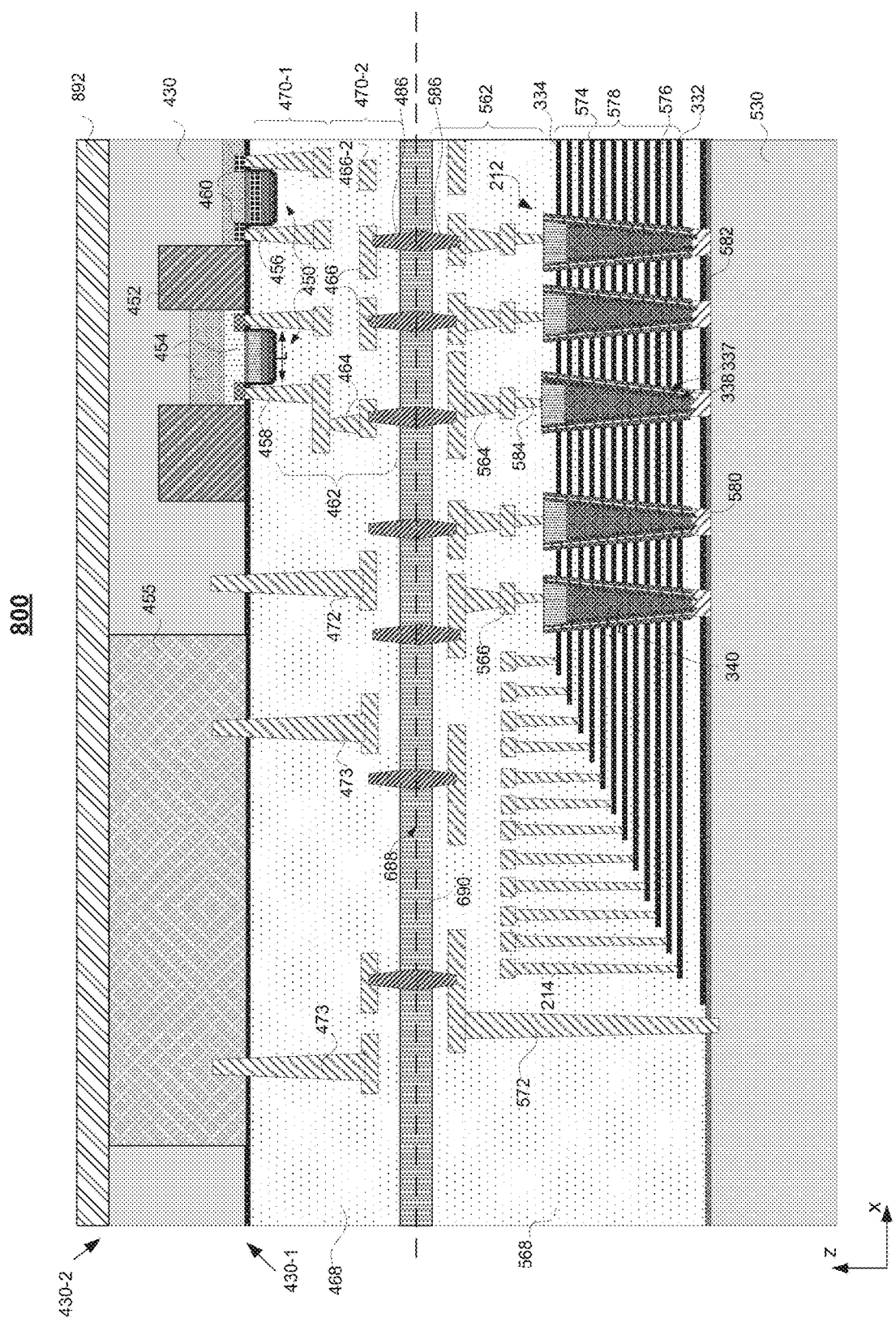

FIG. 8 illustrates a cross-sectional view of a 3D memory device 800, according to some embodiments of the present disclosure. The 3D memory device 800 can be formed by disposing a capping layer 892 on the backside 430-2 (or the second side) of the first substrate 430. The capping layer 892 can be any suitable insulator, such as silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof. After deposition, the capping layer 892 covers the entire surface of the first substrate 430 including the deep well 455.

Figure 9A:
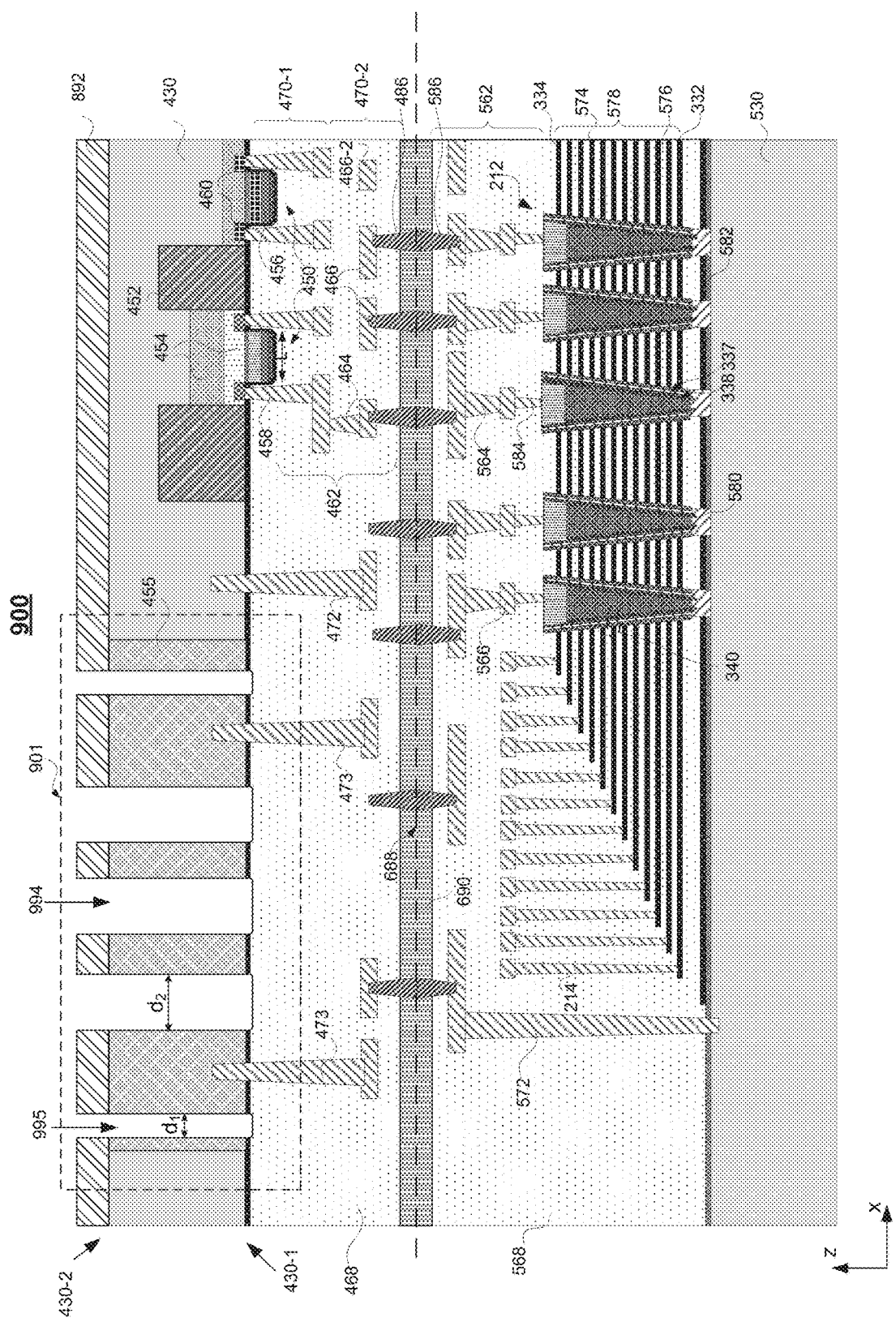

FIG. 9A illustrates a cross-sectional view of a 3D memory device 900, according to some embodiments of the present disclosure, wherein the 3D memory device 900 includes a plurality of trenches 994 and a through-silicon-trench (TST) 995 formed on the backside 430-2 (the second side) of the first substrate 430. In this example, through-silicon-trench 995 penetrates through the capping layer 892 and the entire first substrate 430, exposing the insulating layer 468 at the bottom of the trenches. In some embodiments, the trenches 994 can be similar to the TST 995 and can extend through the capping layer 892 and the entire first substrate 430, exposing the insulating layer 468 at the bottom of the trenches (as shown in FIG. 9A). In some embodiments, the trenches 994 can extend through the capping layer 892 into the deep well 455 of the first substrate 430, but leaving a portion of the deep well 455 at the bottom of the trenches.

The trenches 994 and TST 995 can be formed by using photolithography and etching. The etching process used for the trenches 994 and TST 995 can include wet chemical etching, reactive ion etching (ME), high-aspect ratio plasma etching, or any combination thereof. In some embodiments, the silicon of the first substrate 430 can be etched by alternating plasma etching using $SF_6$ chemistry and protection film deposition using $C_4F_8$ chemistry. In some embodiments, the trenches 994 and TST 995 can be formed sequentially, e.g., the TST 995 can be formed first and then the trenches 994 can be formed, or vice versa.

In some embodiments, the width $d_1$ of the TST 995 can be narrower than the width $d_2$ of the trenches 994. In some embodiments, the TST 995 can be formed inside the deep well 455 (as shown in FIG. 9A).

In some embodiments, ion implantation can be performed after forming the trenches 994 to modify doping profile or concentration in the deep well 455 along sidewalls of the trenches 994.

In FIG. 9A, region 901 highlights a precursor region for a 3D capacitor according to some embodiments of the present disclosure, and will be further discussed in detail.

FIG. 9B illustrates an enlarged cross-sectional view of the region 901 of the 3D memory device 900 in FIG. 9A, and FIG. 9C illustrates a corresponding layout of region 901, according to some embodiments of the present disclosure. In FIG. 9C, the capping layer 892 is omitted to show the underlying layers in the top-down view and the deep well contacts 473 are shown as reference.

In some embodiments, the TST 995 forms an enclosed area, a capacitor precursor region 903. The TST 995 can isolate the capacitor precursor region 903 from other devices on the first substrate 430, i.e., the TST 995 defines an active area for a 3D capacitor. As such, the capacitor precursor region 903 is also referred to as the active area for a 3D capacitor.

In some embodiments, TST 995 can be formed by etching through the deep well 455, i.e., the TST 995 is sandwiched or surrounded by the deep well 455 (as shown in FIGS. 9B and 9C.)

Figure 9E:
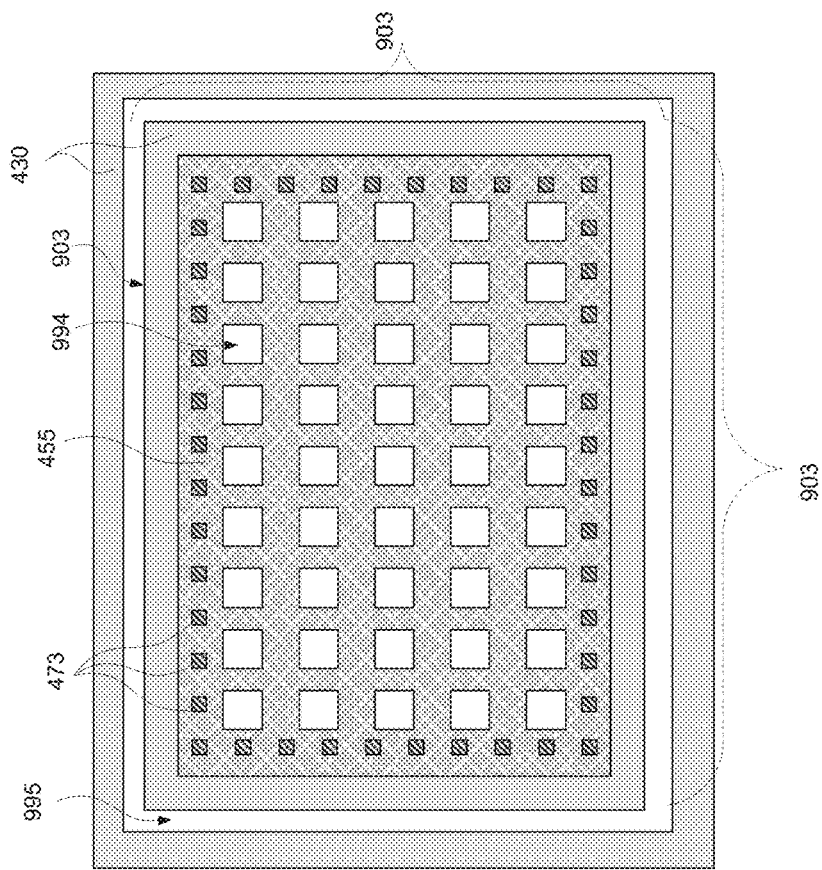
FIGS. 9D and 9E illustrate a cross-sectional and top-down views of a region of a 3D memory device, according to some embodiments of the present disclosure.
Figure 9D:
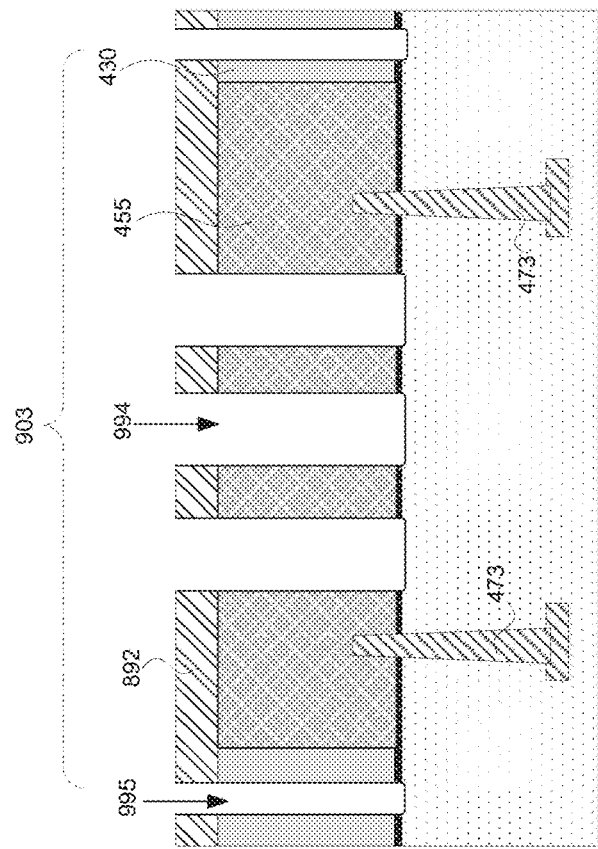
Figure 9F:
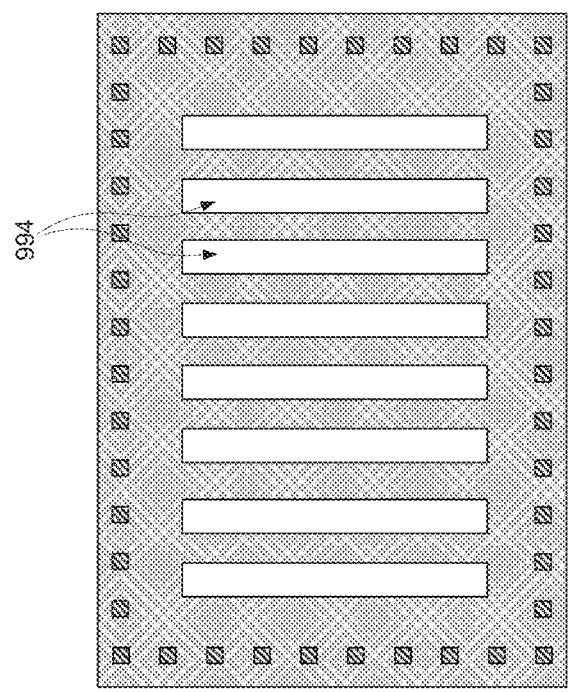
FIGS. 9F and 9G illustrate top-down views of a region of a 3D memory device, according to some embodiments of the present disclosure.
Figure 9G:
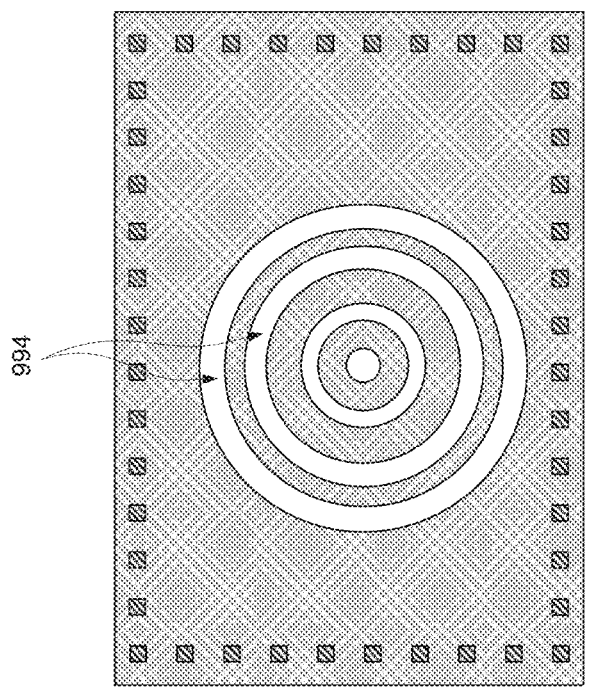

In some embodiments, TST 995 can be formed by etching through the relatively lightly doped area of the first substrate 430, i.e., TST 995 situates outside the deep well 455 (as shown in FIGS. 9D and 9E). In this example, the capacitor precursor region 903 enclosed by the TST 995 includes both deep well 455 and a portion of lightly doped first substrate 430.

In FIG. 9C, the trenches 994 are laid out in squares and arranged in an array. In some embodiments, the trench 994 can be rectangular, circular, or any other shape. The arrangement of trenches 994 can be interdigitated fingers (shown in FIG. 9F), concentric circles (shown in FIG. 9G), etc. For simplicity, layout in FIG. 9C will be used as examples in the following descriptions to illustrate structures and methods for forming a 3D capacitor for a memory device. It is known to the person skilled in the art to reproduce similar features for other layouts and designs.

Figure 10:
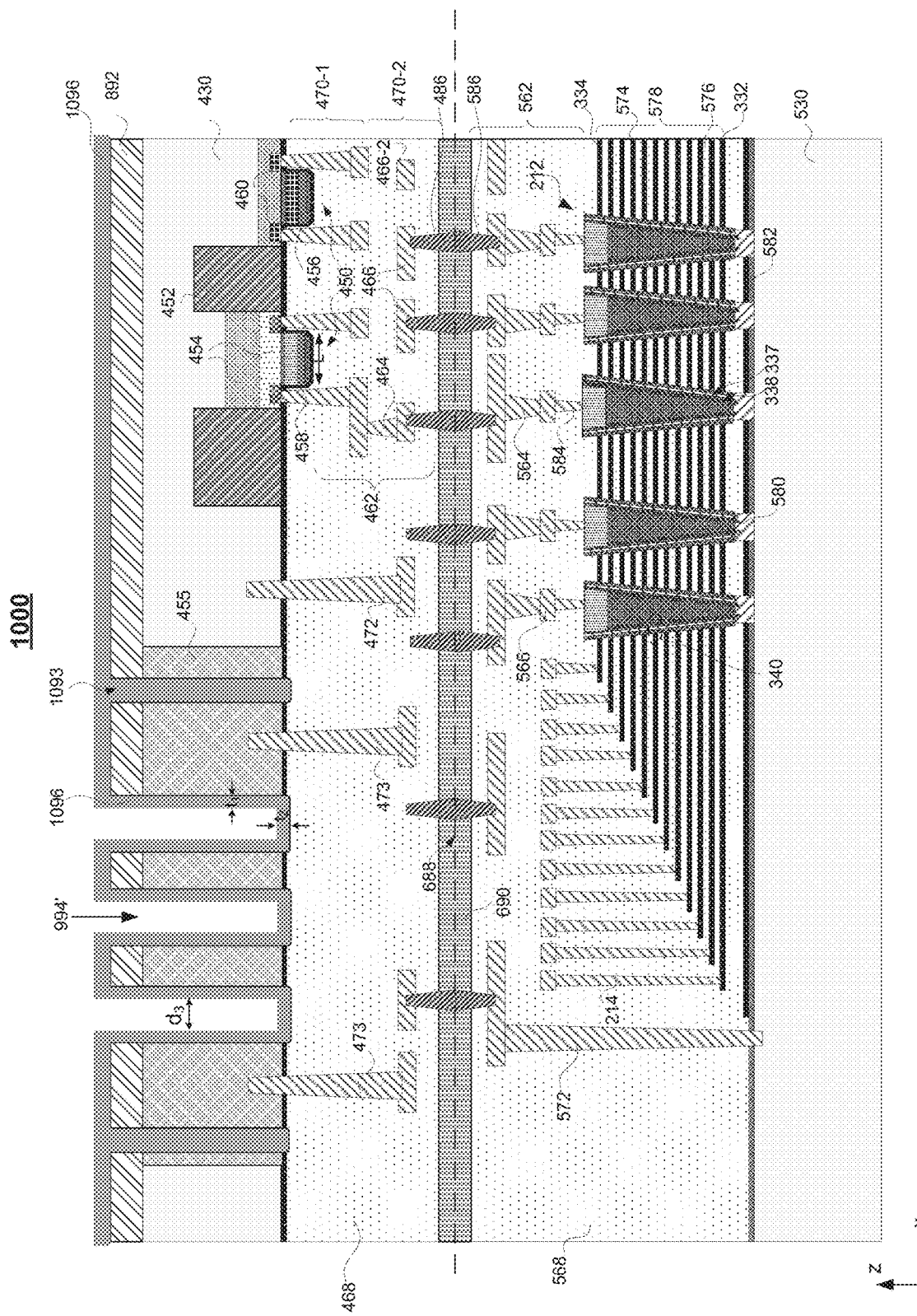
FIGS. 10 and 11A illustrate cross-sectional views of a 3D memory device at various process stages, according to some embodiments of the present disclosure.

FIG. 10 illustrates a cross-sectional view of a 3D memory device 1000, according to some embodiments of the present disclosure. The 3D memory device 1000 includes a capacitor dielectric layer 1096 disposed on the 3D memory device 900 in FIG. 9A. The capacitor dielectric layer 1096 can be any suitable dielectric material, for example, silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The capacitor dielectric layer 1096 can be disposed by any suitable methods such as CVD, PVD, PECVD, LPCVD, RTCVD, sputtering, MOCVD, ALD, thermal oxidation or nitridation, or combinations thereof.

In some embodiments, the capacitor dielectric layer 1096 is conformal, covering horizontal and vertical surfaces with similar thickness, i.e., $t_1$ is about the same dimension as $t_2$ in FIG. 10. In some embodiments, the capacitor dielectric layer 1096 can have a different thickness on horizontal and vertical surfaces, i.e., $t_1 \neq t_2$. In some embodiments, the thicknesses $t_1$ and $t_2$ of the capacitor dielectric layer 1096 can be in a range of 10 nm to 2000 nm.

In some embodiments, the width $d_1$ of the TST 995 in FIG. 9A can be narrower than the width $d_2$ of the trenches 994. In this example, the capacitor dielectric layer 1096 can completely fill up the TST 995 to form a deep trench isolation (DTI) 1093 if the thickness $t_1$ of the capacitor dielectric layer 1096 is more than half the width $d_1$ of the TST 995. In the meantime, after depositing the capacitor dielectric layer 1096, trench 994 can have an opening 994', wherein the opening 994' can have a width $d_3$ equivalent to $d_2-2t_1$.

In some embodiments, the formation of DTI 1093 and the deposition of the capacitor dielectric layer 1096 can be performed sequentially. For example, the TST 995 can be formed first from the backside 430-2 of the first substrate 430, followed by deposition of an insulating material inside the TST 995 to form DTI 1093. In this example, the insulating material for the DTI 1093 can have a thickness larger enough to completely fill up the TST 995. As an option, the insulating material for the DTI 1093 outside the TST 995 can be removed by planarization process such as chemical-mechanical-polishing (CMP) or RIE. The trench 994 can then be formed, followed by deposition of the capacitor dielectric layer 1096. In this example, the insulating material for the DTI 1093 can be different from the capacitor dielectric layer 1096.

Figure 11A:
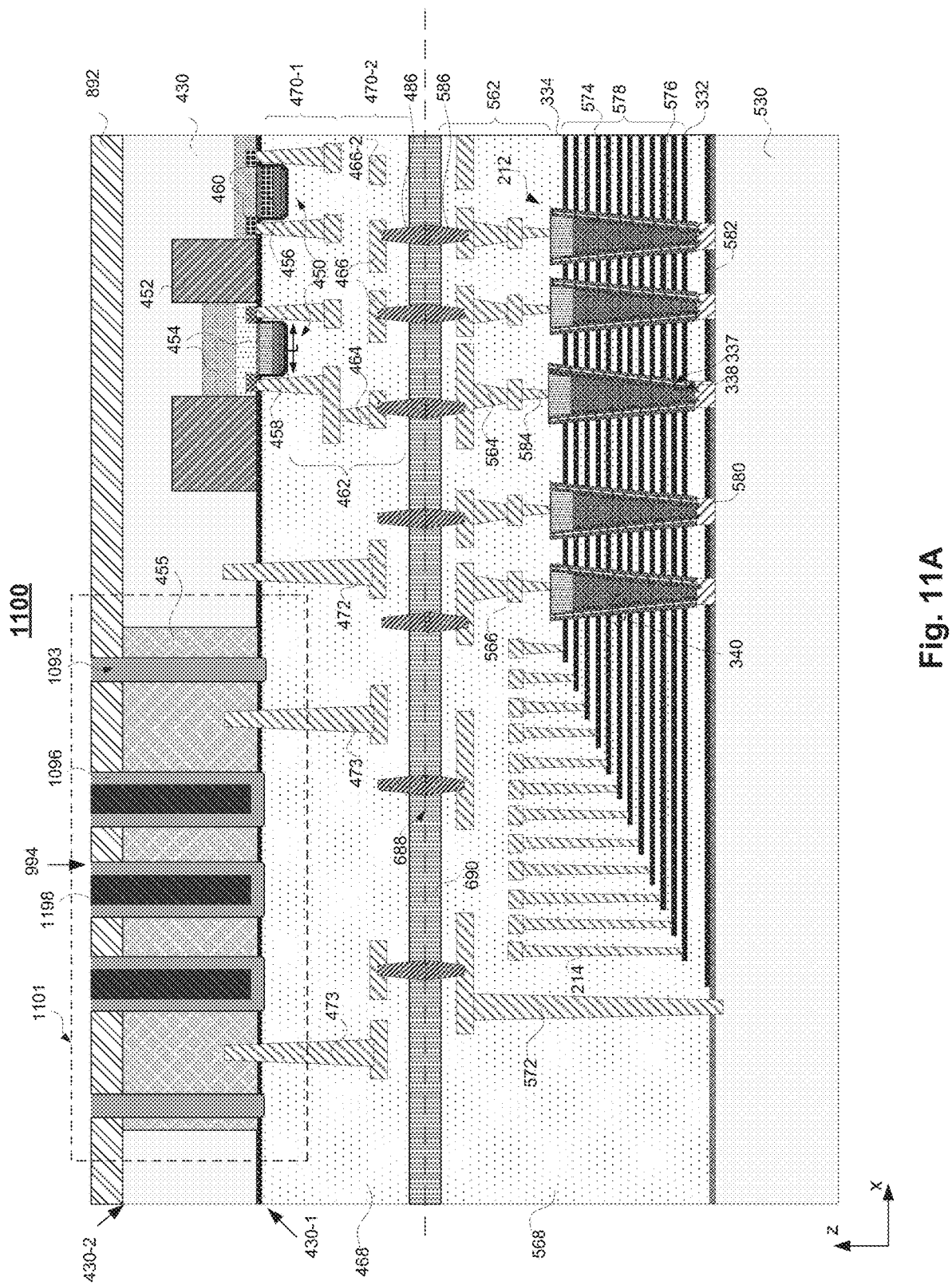

FIG. 11A illustrates a cross-sectional view of a 3D memory device 1100, according to some embodiments of the present disclosure. The 3D memory device 1100 includes a capacitor contact 1198 formed inside the opening 994' of the 3D memory device 1000 in FIG. 10, wherein the capacitor contact 1198 covers a sidewall of the capacitor dielectric layer 1096 inside the trench 994.

The capacitor contact 1198 can be made from any suitable conductive material, for example, a metal or metal alloy such as tungsten, cobalt, nickel, copper, or aluminum, and/or combinations thereof. In some embodiments, the capacitor contact 1198 can also include a conductive material, such as titanium nitride (TiN), tantalum nitride (TaN), etc. The capacitor contact 1198 can be formed by any suitable deposition methods, for example, sputtering, thermal evaporation, e-beam evaporation, ALD, PVD, and/or combinations thereof.

In some embodiments, the capacitor contact 1198 can also include a poly-crystalline semiconductor, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, etc. In some embodiments, the capacitor contact 1198 can also be an amorphous semiconductor of the aforementioned materials. The poly-crystalline and amorphous semiconductors can be doped with p-type or n-type dopants. The dopants can be incorporated inside the poly-crystalline and amorphous semiconductors by processes such as ion implantation, in-situ doping during deposition, etc. The n-type dopants can be boron and the p-type dopants can be phosphorus or arsenic.

In some embodiments, the capacitor contact 1198 can be a metal silicide, including $WSi_x$, $CoSi_x$, $NiSi_x$, or $AlSi_x$, etc. The forming of the metal silicide material can include depositing a poly-crystalline semiconductor and a metal layer inside the opening 994' using similar techniques described above. The forming of metal silicide can further include applying a thermal annealing process on the deposited metal layer and the poly-crystalline semiconductor layer. In some embodiments, unreacted metal after silicide formation can be removed by, for example, wet chemical etching.

In some embodiments, capacitor contact 1198 can be coplanar with the capping layer 892 by implementing a planarization process, for example CMP or RIE, after depositing the conductive material of the capacitor contact 1198. The corresponding structure is shown in FIG. 11A. In this example, the planarization process removes excessive conductive material of the capacitor contacts 1198 and the capacitor dielectric layer 1096 outside the trenches 994.

In some embodiments, the planarization process removes excessive conductive material of the capacitor contacts 1198 outside trenches 994 and stops on or into the capacitor dielectric layer 1096. As such, at least a portion of the capacitor dielectric layer 1096 remains on the capping layer 892. In this example, the capacitor contact 1198 can be coplanar with the capacitor dielectric layer 1096 on top of the capping layer 892 (not shown in FIG. 11A).

FIG. 11B illustrates an enlarged cross-sectional view of the region 1101 of the 3D memory device 1100 in FIG. 11A, and FIG. 11C illustrates the corresponding top-down view of the region 1101, according to some embodiments of the present disclosure. In FIG. 11C, the capping layer 892 is omitted to show the underlying layers in the top-down view and the deep well contacts 473 are shown as reference.

In some embodiments, the capacitor contact 1198 and the capacitor dielectric layer 1096 are exposed from the second side (backside) 430-2 of the first substrate 430 after planarization of the capacitor contact 1198. In this example, the capacitor contact 1198 covers a sidewall of the capacitor dielectric layer 1096 and the capacitor dielectric layer 1096 covers a sidewall 994s of the trench 994.

As shown in FIGS. 11B and 11C, a 3D capacitor 1195 is formed in the region 1101 of the 3D memory device 1100. The 3D capacitor 1195 includes a plurality of vertical capacitors 1197 inside the active area 903 defined by the deep trench isolation 1093, wherein the DTI 1093 isolates the 3D capacitor 1195 from other devices of the 3D memory device 1100. Each vertical capacitor 1197 includes the capacitor dielectric layer 1096 sandwiched between the capacitor contact 1198 and the deep well 455, wherein the capacitor contact 1198 is surrounded by the capacitor dielectric layer 1096 and the capacitor dielectric layer 1096 is surrounded by the deep well 455.

Figure 12A:
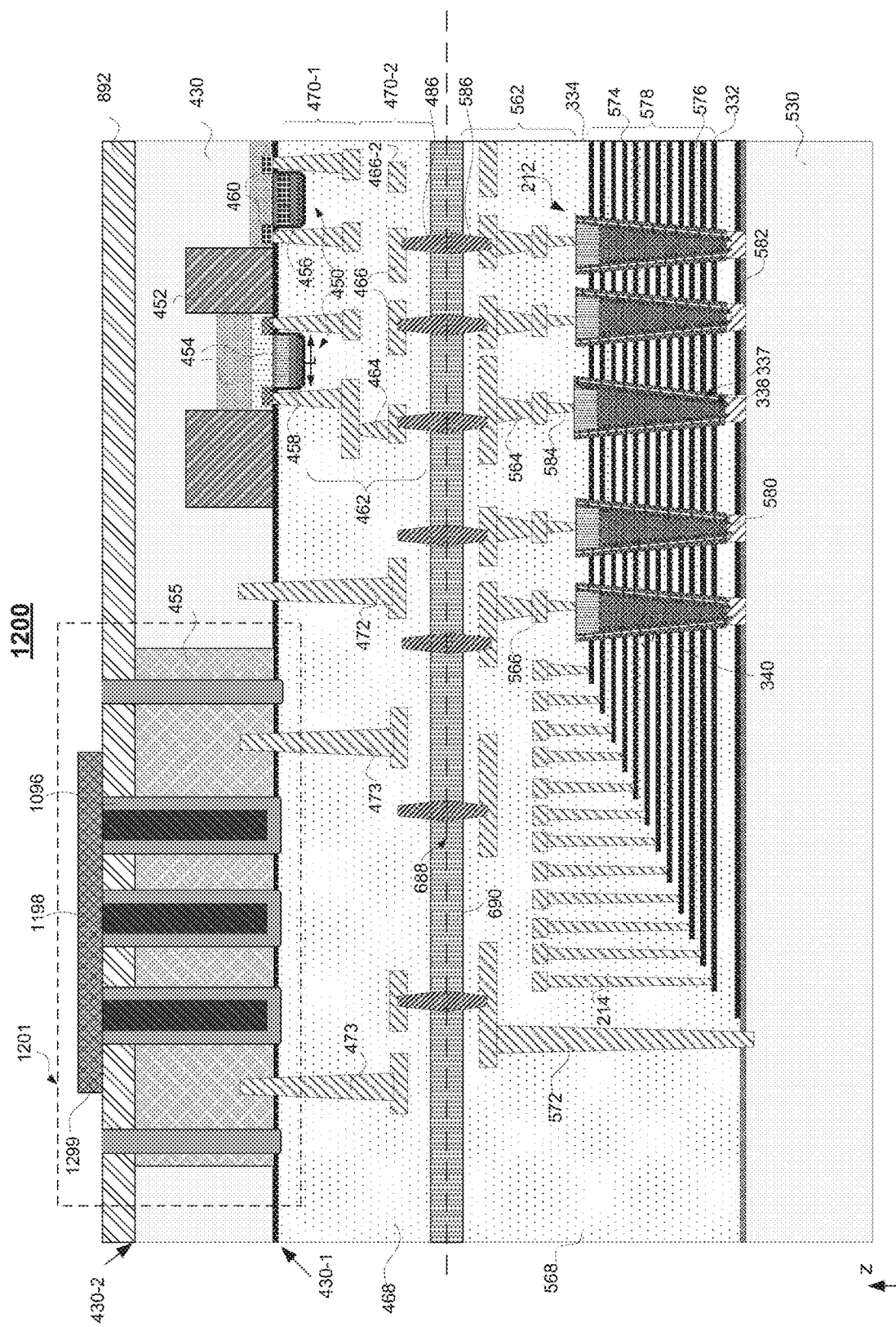
FIG. 12A illustrates a cross-sectional view of a 3D memory device at a certain process stage, according to some embodiments of the present disclosure.

FIG. 12A illustrates a cross-sectional view of a 3D memory device 1200, according to some embodiments of the present disclosure. The 3D memory device 1200 includes a second capacitor electrode 1299 on the capacitor contacts 1198 on the second side 430-2 of the first substrate 430. The second capacitor electrode 1299 forms electrical connections with the capacitor contacts 1198.

In some embodiments, the second capacitor electrode 1299 can be made from any suitable conductive materials such as a metal or metal alloy, for example, tungsten (W), cobalt (Co), copper (Cu), titanium (Ti), tantalum (Ta), aluminum (Al), titanium nitride (TiN), tantalum nitride (TaN), nickel, silicides ($WSi_x$, $CoSi_x$, $NiSi_x$, $AlSi_x$, etc.), or any combination thereof. The conductive materials can be deposited by one or more thin film deposition processes such as CVD, PECVD, PVD, ALD, electroplating, electroless plating, sputtering, evaporation, or any combination thereof.

In some embodiments, the second capacitor electrode 1299 can be patterned using, for example, photolithography and wet/dry etching. In some embodiments, the second capacitor electrode 1299 can also be patterned with damascene process, where the damascene process can include, but not limited to, depositing an insulating layer, patterning the insulating layer, depositing a metallic material and performing CMP.

Figure 12C:
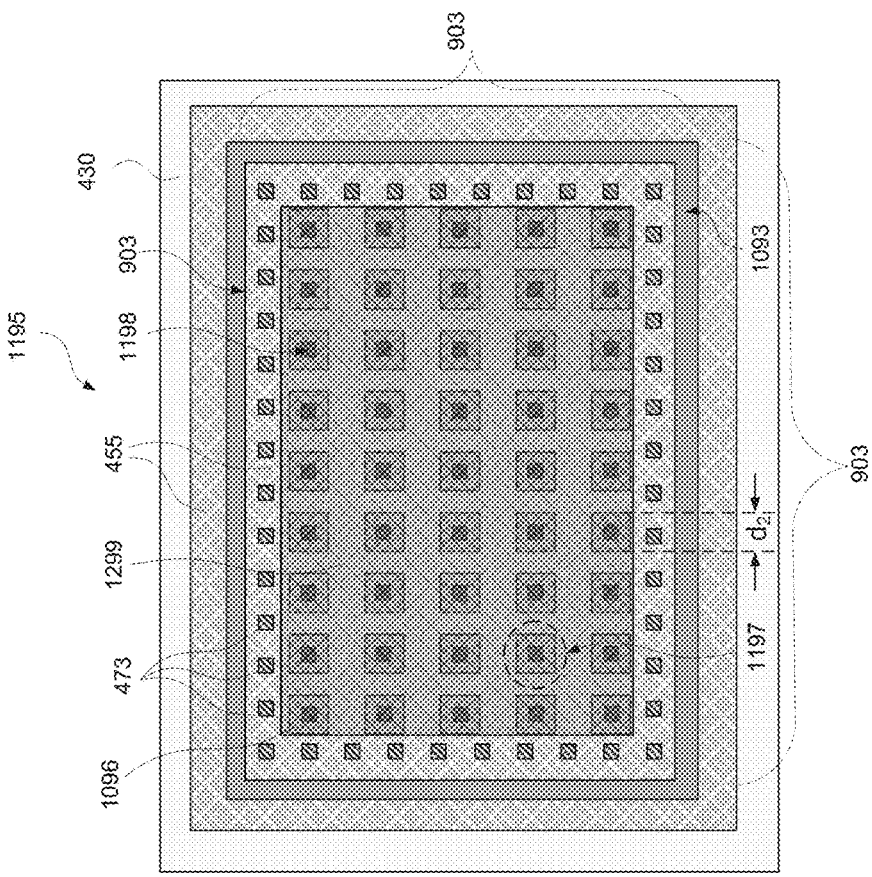
FIGS. 12B and 12C illustrate a cross-sectional and top-down views of a region of a 3D memory device, according to some embodiments of the present disclosure.
Figure 12B:
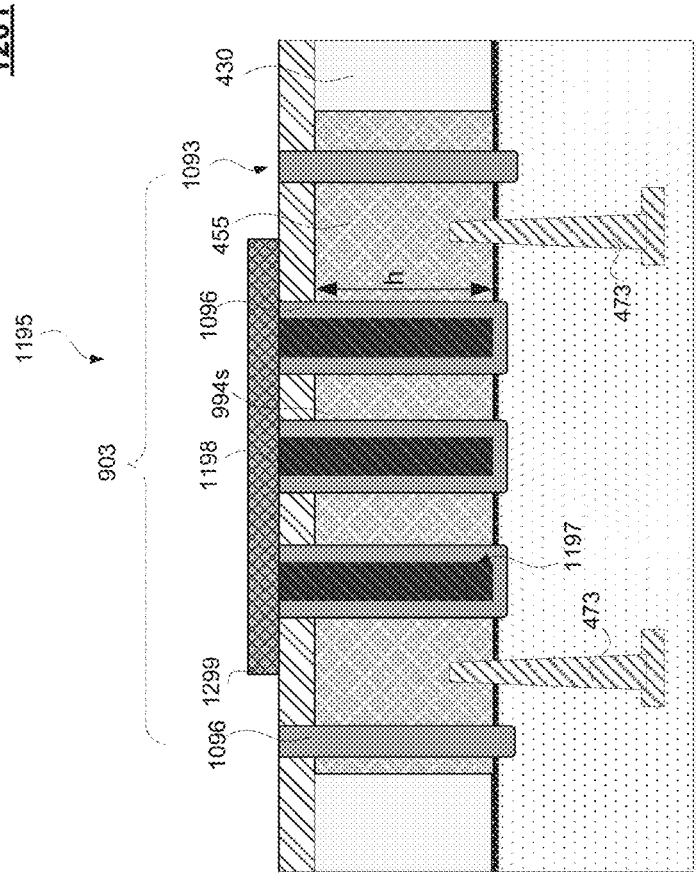

FIG. 12B illustrates an enlarged cross-sectional view of a region 1201 of the 3D memory device 1200 in FIG. 12A, and FIG. 12C illustrates the corresponding top-down view of the region 1201, according to some embodiments of the present disclosure. In FIG. 12C, the capping layer 892 is omitted to show the underlying layers in the top-down view and the deep well contacts 473 are shown as reference.

In some embodiments, the second capacitor electrode 1299 can be connected with all the capacitor contacts 1198 enclosed inside the active area 903 defined by the DTI 1093, providing a common cathode for the 3D capacitor 1195, while the deep well contacts 473 provide a common anode for the 3D capacitor 1195. In some embodiments, the second capacitor electrode 1299 can be the anode and the deep well contacts 473 can be the cathode of the 3D capacitor 1195.

In some embodiments, the capacitance of the 3D capacitor 1195 can be the sum of the vertical capacitors 1197. As such, increasing the number of the vertical capacitors 1197 can increase the capacitance of the 3D capacitor 1195. In addition, increasing the capacitance of the vertical capacitor 1197 can increase the overall capacitance of the 3D capacitor 1195. For example, increasing depth "h" of the vertical capacitors 1197 can increase the capacitance of the 3D capacitor 1195. In some embodiments, increasing thickness of the deep well 455 can allow deeper vertical capacitors 1197. In some embodiments, using capacitor dielectric layer 1096 with higher dielectric constant can also increase the capacitance of the vertical capacitor 1197 and the 3D capacitor 1195.

In some embodiments, the vertical capacitor 1197 has a square cross-section where the width $d_2$ is determined at formation of trench 994 (see FIG. 9A). In this example, the effective device area of the vertical capacitor 1197 is determined by $4d_2 \cdot h$. To reduce area consumption on a wafer (e.g., the first substrate 430), the structure of the vertical capacitor 1197 can allow scaling the width $d_2$ without scarifying the capacitance by increasing the depth "h". Therefore, comparing with traditional 2D capacitors, vertical capacitor 1197 and 3D capacitor 1195 can provide high density and high capacitance for the 3D memory device 1200.

Figure 13:
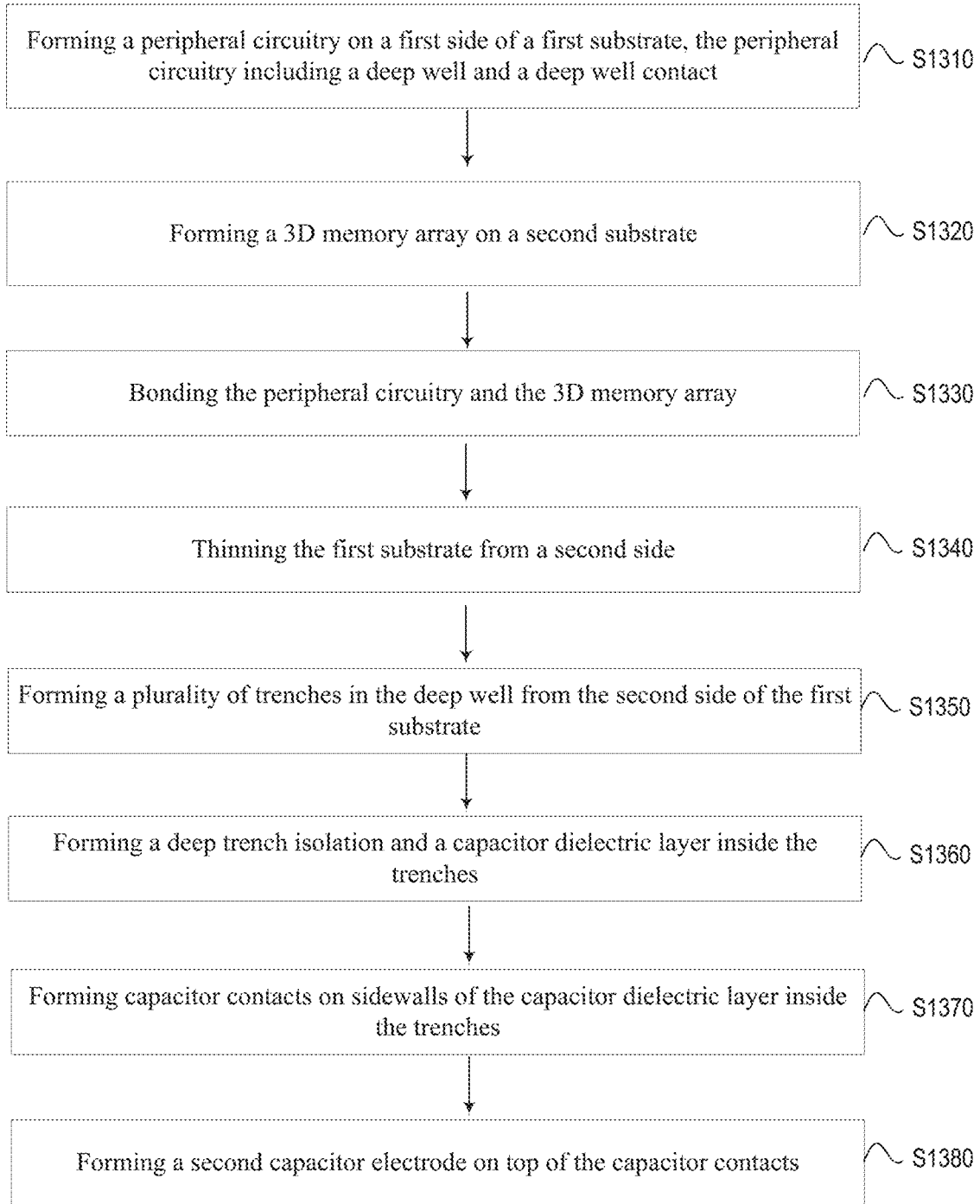
FIG. 13 illustrate a flow diagram of an exemplary method for forming a memory device with a 3D capacitor, according to some embodiments of the present disclosure.

FIG. 13 illustrates an exemplary fabrication process 1300 for forming the 3D memory devices shown in FIGS. 4-8, 9A-9G, 10, 11A-11C and 12A-12C, in accordance with some embodiments. It should be understood that the operations shown in fabrication process 1300 are not exhaustive and that other operations can be performed as well before, after, or between any of the illustrated operations. In some embodiments, some process steps of exemplary fabrication process 1300 can be omitted or include other process steps that are not described here for simplicity. In some embodiments, process steps of method 1300 can be performed in a different order and/or vary.

As shown in FIG. 13, fabrication process 1300 starts at process step S1310, in which a peripheral circuitry is formed on a first side of a first substrate. In some embodiments, the forming of the peripheral circuitry includes forming one or more peripheral devices and a peripheral interconnect layer. The forming of the peripheral circuitry further includes forming a deep well and a deep well contact (or a first capacitor electrode) on the first side of the first substrate. As an example, the peripheral circuitry can be the peripheral circuitry 400 shown in FIG. 4, including the peripheral device 450 and the peripheral interconnect layer 462. The fabrication process for the peripheral circuitry can be similar to fabrication process for the peripheral circuitry 400.

In some embodiments, the deep well, such as the deep well 455 in FIG. 4, can be formed by ion implantation prior to well implantation for the peripheral devices. Forming the deep well can also include an activation annealing. The deep well can also be formed by epitaxy and in-situ doping. An epitaxial layer can be deposited as a blank film on the first substrate or can be deposited in a selected region on the first substrate where silicon oxide or nitride can be used as an mask during the epitaxy process.

In some embodiments, the deep well contact (or the first capacitor electrode), such as the deep well contact 473 in FIG. 4, can be formed during middle-end-of-line and/or back-end-of-line fabrication for the peripheral interconnect layer. The deep well contact can include one or more vertical contact structures and lateral conductive lines. The forming of the deep well contact can include forming a trench by etching through an insulating layer (e.g., insulating layer 468) and filling the trench with a conductive material. The conductive material can be patterned by conventional lithography and wet/dry etching or by planarization process such as CMP and/or RIE etch back. The forming of the deep well contact can also include dual damascene process, for example, etching the insulating layer 468 for both vertical contact structure and lateral conductive line prior to the deposition of the conductive material and planarization process.

In some embodiments, a plurality of peripheral interconnect VIAs can be formed for the peripheral circuitry 400. The peripheral interconnect VIAs can be the interconnect VIAs 486 in FIG. 6, and can be made of similar material. The peripheral interconnect VIAs are formed to make electrical connections for the peripheral circuitry. The fabrication processes for the peripheral interconnect VIA include, lithography, trench formation using wet/dry etching, disposing and filling conductive material inside the trench, and removing excess materials outside the trench by using a planarization process such as CMP.

In some embodiments, a bonding layer can be disposed on the peripheral circuitry. The bonding layer can be the bonding layer 690 in FIG. 6, and can be fabricated using similar techniques.

At process step S1320, a 3D memory array is formed on a second substrate. In some embodiments, the 3D memory array can be the 3D memory array 500 in FIG. 5. The 3D memory array can include a plurality of memory cells and an array interconnect layer, for example, the memory cells 340 and the array interconnect layer 562. In some embodiments, the 3D memory array is a 3D NAND flash memory and can include at least a memory string (e.g., the memory string 212) and a staircase structure.

In some embodiments, fabrication of the 3D memory array 500 can include forming a plurality of dielectric layer pairs (also referred to herein as an "alternating dielectric stack") with a first dielectric layer 576 and a second dielectric layer (not shown in figures) that is different from first dielectric layer 576. In some embodiments, the first dielectric layer can be silicon oxide and the second dielectric layer can be silicon nitride. Alternating dielectric stack can be formed by one or more thin film deposition processes such as CVD, PVD, ALD, sputtering, or any combination thereof.

In some embodiments, fabrication of the 3D memory array 500 can also include forming a staircase structure at an end of the alternating dielectric stack by using multiple etch-trim processes.

In some embodiments, fabrication of the 3D memory array 500 can also include removing the second dielectric layer and replacing with a conductor layer 574 to form an alternating conductor/dielectric stack 578. The replacement of the second dielectric layers with conductor layers 574 can be performed by wet etching the second dielectric layers selective to first dielectric layers 576 and filling the structure with conductor layers 574. The conductor layer 574 includes polysilicon, W, Co, Ti, TiN, Ta, TaN, Al, Ni, silicides, etc., and can be filled by CVD, ALD, etc.

In some embodiments, fabrication of the 3D memory array 500 can further include forming a plurality of memory strings 212 penetrating alternating conductor/dielectric stack 578. In some embodiments, fabrication processes to form memory strings 212 can include forming a channel layer 338 that extends vertically through alternating conductor/dielectric stack 578. In some embodiments, channel layer 338 can be an amorphous silicon layer or a polysilicon layer formed by using a thin film deposition process, such as a CVD, ALD, etc.

In some embodiments, fabrication processes to form memory strings 212 can further include forming a memory film 337 between the channel layer 338 and the plurality of conductor/dielectric layer pairs in alternating conductor/dielectric stack 578. Memory film 337 can be a composite dielectric layer, such as a combination of multiple dielectric layers such as a blocking layer, a storage layer, and a tunneling layer.

The blocking layer can be used for blocking the outflow of the electronic charges. In some embodiments, the blocking layer can be a silicon oxide layer or a combination of silicon oxide/silicon oxynitride/silicon oxide ($SiO_2$—SiON—$SiO_2$) multi-layer stack. In some embodiments, the blocking layer includes high dielectric constant (high-k) dielectrics (e.g., aluminum oxide). In one example, the blocking layer includes a silicon oxide layer formed by In-Situ Steam Generation (ISSG) oxidation after a silicon nitride deposition process.

The storage layer can be used for storing electronic charges. The storage and/or removal of charges in the storage layer can impact the on/off state and/or a conductance of the semiconductor channel. The storage layer can include polycrystalline silicon (polysilicon) or silicon nitride. The storage layer can include one or more films of materials including, but are not limited to, silicon nitride, silicon oxynitride, a combination of silicon oxide and silicon nitride, or any combination thereof. In some embodiments, the storage layer can include a nitride layer formed by using one or more deposition processes.

The tunneling layer can be used for tunneling electronic charges (electrons or holes). The tunneling layer can be dielectric materials such as silicon oxide, silicon nitride, silicon oxynitride, or any combination thereof. In some embodiments, the tunneling layer can be an oxide layer formed by using a deposition process.

In some embodiments, fabrication of the 3D memory array 500 can further include forming an epitaxial layer 580 at an end of memory string 212. In some embodiments, epitaxial layer 580 can be formed in the second substrate, and correspond to each memory string 212 as an epitaxial plug 580. Epitaxial layer 580 can be implanted to a desired doping level.

In some embodiments, fabrication of the 3D memory array 500 can further include forming multiple word line contacts. As illustrated in FIG. 5, each word line contact structure 214 can extend vertically to form electrical contact to a corresponding conductor layer 574 of the staircase structure, wherein each conductor layer 574 can individually control a memory cell of memory strings 212. In some embodiments, fabrication processes to form word line contact structures 214 include forming a vertical opening through an insulating layer 568 using dry/wet etch process, followed by filling the opening with conductive materials such as W, Co, Cu, Al, doped poly-silicon, silicides, or any combination thereof. The conductive materials can be disposed by ALD, CVD, PVD, plating, sputtering, or any combination thereof.

In some embodiments, fabrication of the 3D memory array 500 can further include forming the array interconnect layer 562, which can electrically connect the memory strings with word lines and bit lines. As shown in FIG. 5, in some embodiments, the array interconnect layer 562 can include one or more contact structures 564 and conductive lines 566 in the insulating layer 568. In some embodiments, fabrication processes to form array interconnect layer 562 include forming the insulating layer 568, followed by forming a plurality of bit line contacts 584 in contact with memory strings 212 in the insulating layer 568. The insulating layer 568 can include one or more layers of dielectric materials such as silicon oxide, silicon nitride, silicon oxynitride, or any combination thereof. The insulating layer 568 can be formed by one or more thin film deposition processes such as CVD, PVD, PECVD, ALD, high-density-plasma CVD (HDP-CVD), sputtering, spin-coating, or any combination thereof. Bit line contacts 584 can be formed by forming openings in the insulating layer 568, followed by filling the openings with conductive materials such as W, Co, Cu, Al, Ti, TiN, Ta, TaN, doped silicon, silicides, or any combination thereof, deposited by CVD, PVD, sputtering, evaporating, plating, or any combination thereof.

In some embodiments, fabrication processes to form array interconnect layer 562 further include forming one or more conductive lines 566 and one or more contact structures 564 in the insulating layer 568. Conductor layers and contact layers can include conductor materials such as W, Co, Cu, Al, Ti, Ta, TiN, TaN, doped silicon, silicides, or any combination thereof. Conductor layers and contact layers can be formed by any suitable known BEOL methods.

In some embodiments, other structures can also be formed on the 3D memory array, for example, a bonding layer, a plurality of interconnect VIAs and a substrate contact, which are illustrated in FIGS. 5 and 6, as the bonding layer 690, the interconnect VIAs 586 and the substrate contact 572.

In some embodiments, the bonding layer 690 can be disposed on the 3D memory array 500 after completing the array interconnect layer 562. The bonding layer 690 can include dielectric materials such as silicon oxide, silicon nitride, silicon oxynitride or any combination thereof. The bonding layer 690 can also include adhesion materials, for example, epoxy resin, polyimide, dry film, photosensitive polymer, etc. The bonding layer 690 can be formed by one or more thin film deposition processes such as CVD, PVD, PECVD, ALD, high-density-plasma CVD (HDP-CVD), sputtering, spin-coating, or any combination thereof.

In some embodiments, the interconnect VIAs 586 can be formed in the array interconnect layer 562, electrically connected with one or more of the conductive lines 566 and/or the contact structures 564 on the 3D memory array 500. The fabrication process of the interconnect VIA 586 can be similar to the interconnect VIA 486.

At process step S1330, the peripheral circuitry can be bonded to the 3D memory array to form a 3D memory device, wherein the 3D memory device can be the 3D memory device 600 in FIG. 6.

In some embodiments, the peripheral circuitry 400 and the 3D memory array 500 can be bonded together at die level (e.g., die-to-die, or chip-to-chip) or at wafer level (e.g., wafer-to-wafer or chip-to-wafer), depending on the product design and manufacturing strategy. Bonding at wafer level can provide high throughput, where all the dies/chips on the first substrate with the peripheral circuitry 400 can be joined simultaneously with the second substrate with the 3D memory array 500. Individual 3D memory device 600 can be diced after wafer bonding. On the other hand, bonding at die level can be performed after dicing and die test, where functional dies of the peripheral circuitry 400 and 3D memory array 500 can be selected first and then bonded to form 3D memory device 600, enabling higher yield of 3D memory device 600.

In some embodiments, the 3D memory array 500 can be flipped upside down and positioned above the peripheral circuitry (or vice versa). The array interconnect layer 562 of the 3D memory array 500 can be aligned with the peripheral interconnect layer 462 of the peripheral circuitry 400.

In some embodiments, aligning the array interconnect layer 562 with peripheral interconnect layer 462 is performed by aligning interconnect VIAs 586 of the 3D memory array 500 with corresponding interconnect VIAs 486 of the peripheral circuitry 400. As a result, corresponding interconnect VIAs can be connected at a bonding interface 688 and the 3D memory array 500 can be electrically connected with the peripheral circuitry 400.

In some embodiments, the peripheral circuitry 400 and the 3D memory array 500 can be joined by hybrid bonding. Hybrid bonding, especially metal/dielectric hybrid bonding, can be a direct bonding technology (e.g., forming bonding between surfaces without using intermediate layers, such as solder or adhesives), which obtains metal-metal bonding and dielectric-dielectric bonding simultaneously. As illustrated in FIG. 6, the 3D memory array 500 can be joined with the peripheral circuitry 400, thereby forming the bonding interface 688.

In some embodiments, a bonding layer can be formed on the peripheral circuitry 400 and/or 3D memory array 500 prior to hybrid bonding. At the bonding interface 688, the bonding can take place between silicon nitride to silicon nitride, silicon oxide to silicon oxide, or silicon nitride to silicon oxide, in addition to metal to metal bonding. In some embodiments, the bonding layer can also include an adhesive material to enhance bonding strength, for example, epoxy resin, polyimide, dry film, etc.

In some embodiments, a treatment process can be used to enhance the bonding strength at the bonding interface 688. The treatment process can prepare the surfaces of array interconnect layer 562 and the peripheral interconnect layer 462 so that the surfaces of the insulating layers 568/468 form chemical bonds. The treatment process can include, for example, plasma treatment (e.g. with F, Cl or H containing plasma) or chemical process (e.g., formic acid). In some embodiments, the treatment process can include a thermal process that can be performed at a temperature from about 250° C. to about 600° C. in a vacuum or an inert ambient (e.g., with nitrogen or Argon). The thermal process can cause metal inter-diffusion between the interconnect VIAs 586 and 486. As a result, metallic materials in the corresponding pairs of the interconnect VIAs can be inter-mixed with each other or forming alloy after the bonding process.

At process step S1340, the first substrate can be thinned after bonding. The thinning process can be performed from a second side (or backside) of the first substrate, wherein the second side of the first substrate is opposite the first side, further away from the peripheral devices. After thinning, the deep well can be exposed from the second side of the first substrate.

In some embodiments, a handle wafer (e.g., glass, plastic, or silicon) can be attached to the second substrate prior to the thinning process. In some embodiments, substrate thinning process can include one or more of grinding, dry etching, wet etching, and chemical mechanical polishing (CMP).

After thinning the first substrate, a capping layer can be deposited on the second side of the first substrate. The capping layer can be the capping layer 892 in FIG. 8, and can be made from similar material using similar process.

At process step S1350, a plurality of trenches (e.g., trenches 994 in FIG. 9A) are formed inside the deep well. The trenches can be formed by patterning the capping layer and the deep well. The patterning process can include photolithography and wet/dry etching. The patterning process can be performed from the second side of the first substrate. In some embodiments, the trenches penetrates through the deep well 455 or the first substrate 430. In some embodiments, the trenches extend into a portion of the deep well 455.

In some embodiments, a through-silicon-trench (TST), for example, TST 995 in FIG. 9A can be formed simultaneously as the trenches 994. In some embodiments, the TST 995 can have a width narrower than the trenches 994.

At process step S1360, a capacitor dielectric layer is disposed on sidewalls of trench 994 and TST 995. The capacitor dielectric layer can be the capacitor dielectric layer 1096 in FIG. 10, and can be made from a similar material using a similar process.

In some embodiments, a deep trench isolation (e.g., the deep trench isolation 1093) can be formed after depositing the capacitor dielectric layer 1096 in the TST 995, as shown in FIG. 10. In this example, the capacitor dielectric layer 1096 completely fills up the TST 995, while leaving openings in trenches 994.

At process step S1370, an capacitor contact is formed on a sidewall of the capacitor dielectric layer 1096 inside the trench 994. The capacitor contact can be the capacitor contact 1198 in FIG. 11A, and can be made from similar material using a similar process.

At process step S1380, a second capacitor electrode (e.g., the second capacitor electrode 1299 in FIG. 12) is formed on top of the capacitor contacts, forming electrical connections with the capacitor contacts 1198.

In some embodiments, the deep trench isolation can be formed before the formation of the trenches 994. In this example, the TST 995 can be formed in the first substrate first, followed by deposition of an insulating material inside the TST 995. The insulating material can be any suitable insulator, for example, silicon oxide, silicon nitride, silicon oxynitride, TEOS, spin-on-glass, etc. Prior to patterning the trenches 994, an optional planarization process can be used, for example, chemical-mechanical-polishing. The process can then resume with the formation of the trenches 994. In this example, the TST 995 and trenches 994 can have different depth and the TST 995 can be filled with the insulating material different from the capacitor dielectric layer 1096.

The present disclosure describes various embodiments of a three-dimensional (3D) capacitor for a memory device and methods of making the same.

In some embodiments, a method for forming a 3D capacitor for a memory device includes forming, on a first side of a first substrate, a peripheral circuitry including a plurality of peripheral devices, a first interconnect layer, a deep well and a first capacitor electrode, wherein the first capacitor electrode is electrically connected with the deep well. The method also includes forming, on a second substrate, a memory array including a plurality of memory cells and a second interconnect layer. The method further includes bonding the first interconnect layer of the peripheral circuitry with the second interconnect layer of the memory array, such that at least one peripheral device of the peripheral circuitry is electrically connected with at least one memory cell of the memory array. The method also includes forming, on a second side of the first substrate, one or more trenches inside the deep well, wherein the first and second sides are opposite sides of the first substrate. The method further includes disposing a capacitor dielectric layer on sidewalls of the one or more trenches, and forming capacitor contacts on sidewalls of the capacitor dielectric layer inside the one or more trenches.

In some embodiments, a 3D capacitor for a memory device includes a deep well formed on a second side of a first substrate, wherein a first side of the first substrate, opposite of the second side, includes a plurality of peripheral devices and a first interconnect layer. The 3D capacitor also includes a first capacitor electrode electrically connected with the deep well. The 3D capacitor further includes one or more trenches inside the deep well, and a capacitor dielectric layer on sidewalls of the one or more trenches. The 3D capacitor also includes capacitor contacts on sidewalls of the capacitor dielectric layer inside the one or more trenches, and a second capacitor electrode disposed on the capacitor contacts.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional capacitor for a memory device, comprising:

forming, on a first side of a first substrate, a peripheral circuitry comprising a plurality of peripheral devices, a first interconnect layer, a well and, after forming the well, forming a first capacitor electrode, wherein the first capacitor electrode is electrically connected with the well from the first side of the first substrate;

forming, on a second substrate, a memory array comprising a plurality of memory cells and a second interconnect layer;

bonding the first interconnect layer of the peripheral circuitry with the second interconnect layer of the memory array, such that at least one peripheral device of the peripheral circuitry is electrically connected with at least one memory cell of the memory array;

forming, on a second side of the first substrate, one or more trenches extending completely through the well, wherein the first and second sides are opposite sides of the first substrate;

disposing a capacitor dielectric layer on sidewalls of the one or more trenches;

forming capacitor contacts on sidewalls of the capacitor dielectric layer inside the one or more trenches; and forming a second capacitor electrode on the capacitor contacts on the second side of the first substrate.

2. The method of claim 1, further comprising:
thinning the first substrate from the second side after bonding the first and second interconnect layers.

3. The method of claim 2, wherein thinning the first substrate comprises:
exposing the well on the second side of the first substrate.

4. The method of claim 1, further comprising:
prior to forming the one or more trenches, disposing a capping layer on the second side of the first substrate.

5. The method of claim 1, further comprising:
forming a trench isolation to define an active area for the three-dimensional capacitor.

6. The method of claim 5, wherein forming the deep trench isolation comprises:
forming a through-silicon-trench penetrating through the first substrate and exposing a portion of the first interconnect layer; and
disposing an insulating material inside the through-silicon-trench.

7. The method of claim 5, wherein forming the trench isolation comprises:
prior to forming the one or more trenches, forming a through-silicon-trench penetrating through the first substrate and exposing a portion of the first interconnect layer, wherein half of a width of the through-silicon-trench is smaller than a thickness of the capacitor dielectric layer.

8. The method of claim 1, wherein forming the capacitor contacts comprises:
disposing a conductive material on the sidewalls of the capacitor dielectric layer inside the one or more trenches; and
removing the conductive material outside the one or more trenches.

9. The method of claim 8, wherein removing the conductive material outside the one or more trenches comprises chemical mechanical polishing.

10. The method of claim 1, wherein the bonding of the first interconnect layer of the peripheral circuitry with the second interconnect layer of the memory array comprises dielectric-to-dielectric bonding and metal-to-metal bonding at a bonding interface.

11. The method of claim 1, wherein the forming the well comprises forming the well having a depth in a range between 1 μm to 5 μm.

12. The method of claim 1, wherein the forming the well comprises forming the well having a dopant concentration higher than $1\times10^{18}$ cm$^{-3}$.

13. A method for forming a capacitor, comprising:
forming a well in a substrate;
after forming the well, forming a well contact connected to the well from a first side of the substrate;
forming a trench in the well from a second side of the substrate opposite to the first side;
disposing a capacitor dielectric layer on a sidewall of the trench;
disposing a first conductive material inside the trench to form a capacitor contact; and
after forming the well contact, thinning the substrate from the second side.

14. The method of claim 13, further comprising:
forming a trench isolation to define an active area of the capacitor.

15. The method of claim 14, wherein the forming the deep-trench isolation comprises:
forming a through-silicon-trench penetrating through the substrate from the second side; and
disposing an insulating material inside the through-silicon-trench.

16. The method of claim 13, wherein the forming the well comprises forming the well having a depth in a range between 1 μm to 5 μm.

17. The method of claim 13, wherein the forming the well comprises forming the well having a dopant concentration higher than $1\times10^{18}$ cm$^{-3}$.

18. The method of claim 13, wherein the forming the well contact comprises disposing tungsten (W), cobalt (Co), copper (Cu), titanium (Ti), tantalum (Ta), aluminum (Al), titanium nitride (TiN), tantalum nitride (TaN), nickel, silicides, metal alloys, or a combination thereof.

19. The method of claim 13, wherein the disposing the capacitor dielectric layer comprises disposing silicon oxide, silicon nitride, silicon oxynitride, hafnium oxide, zirconium oxide, aluminum oxide, tantalum oxide, magnesium oxide, lanthanum oxide, or a combination thereof.

20. The method of claim 13, further comprising:
disposing a second conductive material on the capacitor contact to form a second capacitor electrode on the second side of the substrate.

* * * * *